US012757702B2

(12) United States Patent
Lanzillo et al.

(10) Patent No.: US 12,757,702 B2
(45) Date of Patent: Oct. 6, 2026

(54) ASYMMETRIC SKIP-LEVEL VIA STRUCTURE

(71) Applicant: International Business Machines Corporation, Armonk, NY (US)

(72) Inventors: Nicholas Anthony Lanzillo, Wynantskill, NY (US); Reinaldo Vega, Mahopac, NY (US); Takashi Ando, Eastchester, NY (US); David Wolpert, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 410 days.

(21) Appl. No.: 18/060,986

(22) Filed: Dec. 2, 2022

(65) Prior Publication Data

US 2024/0186177 A1 Jun. 6, 2024

(51) Int. Cl.
*H10W 20/00* (2026.01)
*H10W 20/41* (2026.01)
*H10W 20/42* (2026.01)

(52) U.S. Cl.
CPC ....... *H10W 20/089* (2026.01); *H10W 20/057* (2026.01); *H10W 20/082* (2026.01); *H10W 20/42* (2026.01); *H10W 20/425* (2026.01); *H10W 20/435* (2026.01)

(58) Field of Classification Search
None
See application file for complete search history.

(56) References Cited

U.S. PATENT DOCUMENTS

| | | | | |
|---|---|---|---|---|
| 9,805,972 | B1 | 10/2017 | Zhang | |
| 10,020,254 | B1 | 7/2018 | Bao | |
| 10,026,687 | B1 | 7/2018 | Lin | |
| 10,319,629 | B1 | 6/2019 | Yang | |
| 11,152,298 | B2 | 10/2021 | Mignot | |
| 11,164,777 | B2 | 11/2021 | Clevenger | |
| 11,270,936 | B2 | 3/2022 | Sio | |
| 2020/0083288 | A1 * | 3/2020 | Kanaya | G11C 11/1655 |
| 2020/0295134 | A1 | 9/2020 | Do | |
| 2021/0391275 | A1 * | 12/2021 | Kuo | H10P 14/432 |
| 2022/0216144 | A1 | 7/2022 | Hsu | |

OTHER PUBLICATIONS

"Super Via with Dual Metallization and Common CMP for Damascene Patterning Scheme", An IP.com Prior Art Database Technical Disclosure, Authors et. al.: Disclosed Anonymously, IP.com No. IPCOM000266507D, IP.com Electronic Publication Date: Jul. 21, 2021, 18 pages.

* cited by examiner

*Primary Examiner* — Kyoung Lee
(74) *Attorney, Agent, or Firm* — Aaron N. Pontikos

(57) ABSTRACT

A semiconductor interconnect structure and formation thereof. The semiconductor interconnect structure includes a skip via. The skip via includes a first skip via segment vertically connected to a second skip via segment. The first skip via segment has a first width and the second skip via segment has a second width.

18 Claims, 17 Drawing Sheets

ASYMMETRIC SKIP-LEVEL VIA STRUCTURE

BACKGROUND OF THE INVENTION

The present invention relates generally to the field of semiconductor devices, and more particularly to interconnect structures having asymmetric skip-level vias.

An integrated circuit (IC) device may be formed with millions of transistors and other circuit elements that are fabricated on a single silicon crystal substrate (wafer). For the IC device to be functional, multi-level or multi-layered interconnection schemes such as, for example, metal wiring formed by single damascene processes, dual damascene processes, subtractive etch processes, and combinations thereof, are fabricated in the back-end-of-the-line (BEOL) of the device to connect the circuit elements distributed on the surface of the device.

In via technology, a “skip-level via” (also known as a “skip via” or “super via”) can be formed through many insulator layers, e.g., bypassing one or more wiring structures within the insulator layers, to connect with a lower wiring structure. This provides improved resistance characteristics, minimizes capacitance for a lower wiring structure, e.g., at MO layer, as well as provides area efficiencies in the chip manufacturing process.

SUMMARY

According to one embodiment of the present invention, a semiconductor interconnect structure is provided. The semiconductor interconnect structure includes a skip via. The skip via includes a first skip via segment vertically connected to a second skip via segment. The first skip via segment has a first width and the second skip via segment has a second width.

According to another embodiment of the present invention, a semiconductor interconnect structure is provided. The semiconductor interconnect structure includes skip via vertically connected to a jumper.

According to another embodiment of the present invention, a method of forming a semiconductor interconnect structure is provided. The method includes forming a first metal level having one or more metal lines. The method further includes forming a second metal level having one or more metal lines above the first metal level. The method further includes forming a third metal level having one or more metal lines above the second metal level. A first metal line of the first metal level has a first centerline that is offset from a second centerline of a second metal line of the third metal level. The method further includes forming a skip via that connects the first metal line of the first metal level to the second metal line of the third metal level. The skip via includes a first skip via segment having a first width that is vertically connected to a second skip via segment having a second width.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which.

Figure 1B:
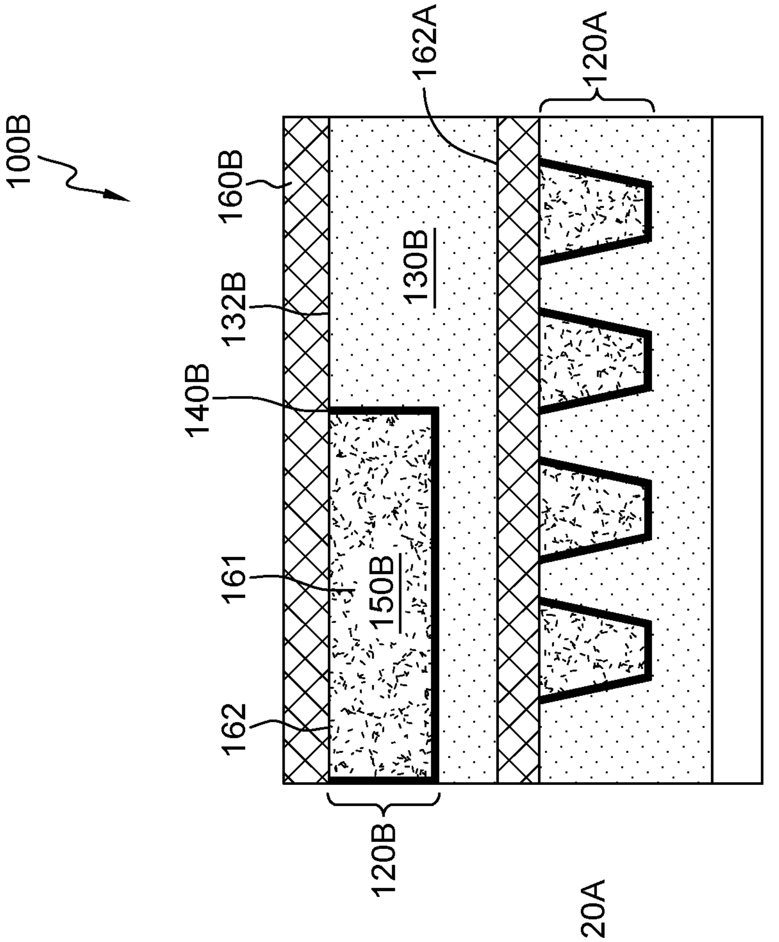
FIG. 1B illustrates a cross-sectional view of semiconductor structure 100A depicted in FIG. 1A after performing subsequent processing steps, generally designated 100B, in accordance with at least one embodiment of the present invention.

When viewed as ordered combinations, FIGS. 1A-1G . . . 3A-3G, and 4-6 illustrate both (i) semiconductor interconnect structures and (ii) the methods for forming such semiconductor interconnect structures, in accordance with illustrative embodiments.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

A skip-level via structure is generally defined as a vertical electrical connection (via) that connects metal lines (or tracks) located within different metal levels by skipping or bypassing metal lines located in one or more metal levels therebetween. Generally, the use of skip-level vias has been limited to when metal lines to be interconnected between different metal layers have similar pitches and are in vertical alignment with one another. Embodiments of the present invention increase the design flexibility of BEOL interconnect structures by providing for skip-level via structures that enable vertical connections to be formed between metal lines located within different metal levels having different pitches and that are not in vertical alignment (or off center) with one another.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below, in conjunction with FIGS. 1A-1G . . . 3A-3G, and 4-6, embodiments of the present invention include semiconductor interconnect structures and methods of forming such semiconductor interconnect structures, and in particular, semiconductor interconnect structures having metal lines located in different metal levels interconnected by asymmetrical skip-level vias. The methods described below in conjunction with FIGS. 4-6 may be incorporated into typical semiconductor memory device fabrication processes. As such, when viewed as ordered combinations, FIGS. 4-6 illustrate methods for forming semiconductor interconnect structures having increased design flexibility.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, terms such as "depositing." "forming." and the like may refer to the disposition of layers, or portions of materials, in accordance with a given embodiment. Such processes may or may not be different than those used in the standard practice of the art of microcooler device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, electroplating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, micromachining, microetching, wet and/or dry etching processes, plasma etching processes, or any of the known etching processes in which material is removed.

Those skilled in the art understand that many different techniques may be used to add, remove, and/or alter various materials, and portions thereof, and that embodiments of the present invention may leverage combinations of such processes to produce the structures disclosed herein without deviating from the scope of the present invention.

As used herein, the term signal via may refer to a via that carries signals between two different lines located in two different metal levels. For example, a signal via may transfer signals from a first line located in a first metal level to a second line located in a second metal level.

As used herein, the term power via may refer to a via that carries either power (VDD) or ground (VSS) between two different lines located in two different metal levels. For example, a power via may transfer power (i.e., power and/or ground) from a first line located in a first metal level to a second line located in a second metal level.

As used herein, the term signal line may refer to a line (i.e., metal line or interconnect) in the back-end-of-the-line (BEOL) of a semiconductor device used to distribute signals between two or more individual devices (e.g., transistors, capacitors, or resistors).

As used herein, the term power line may refer to a line (i.e., metal line or interconnect) in the back-end-of-the-line (BEOL) of a semiconductor device used to distribute power (i.e., power and/or ground) between two or more individual devices (e.g., transistors, capacitors, or resistors).

As used herein, the terms "metal level," "metal layer," "metallization layer," and "backside metal (BSM) layer" may be used interchangeably and may refer to one of a plurality of metal wiring levels in the BEOL of a semiconductor device.

The present invention will now be described in detail with reference to the Figures. FIGS. 1A-1G . . . 3A-3G include various cross-sectional views depicting illustrative steps of methods for manufacturing semiconductor devices and the resulting semiconductor devices according to select embodiments of the present invention. One having ordinary skill in the art will appreciate that there are many options available for the formation of the structures described herein and that the following discussion does not limit embodiments to only the techniques described herein.

Referring now to FIGS. 1A-1G, FIG. 1A illustrates a cross-sectional view of an initial semiconductor structure, generally designated 100A, in accordance with at least one embodiment of the present invention. In assembly of semiconductor structure 100A, a first metal level 120A is formed above substrate 110.

In some embodiments, substrate 110 may include a front-end-of-the-line (FEOL) structure. A FEOL structure is typically present beneath the lowest level of the multilayered interconnect structure and includes a semiconductor substrate having one or more semiconductor devices such as, for example, transistors, capacitors, resistors, and etc. located thereon. In other embodiments, substrate 110 may include one or more interconnect levels of a multilayered interconnect structure, such as a back-end-of-the-line (BEOL) structure. A BEOL structure is typically where the individual semiconductor devices in the FEOL structure are interconnected with one another. In such embodiments, each interconnect level may include one or more electrically conductive structures embedded in an interconnect dielectric material. For example, the one or more interconnect levels of a multilayer interconnect structure may be formed from any generally known semiconductor materials, such as silicon, gallium arsenide, or germanium.

Figure 1A:
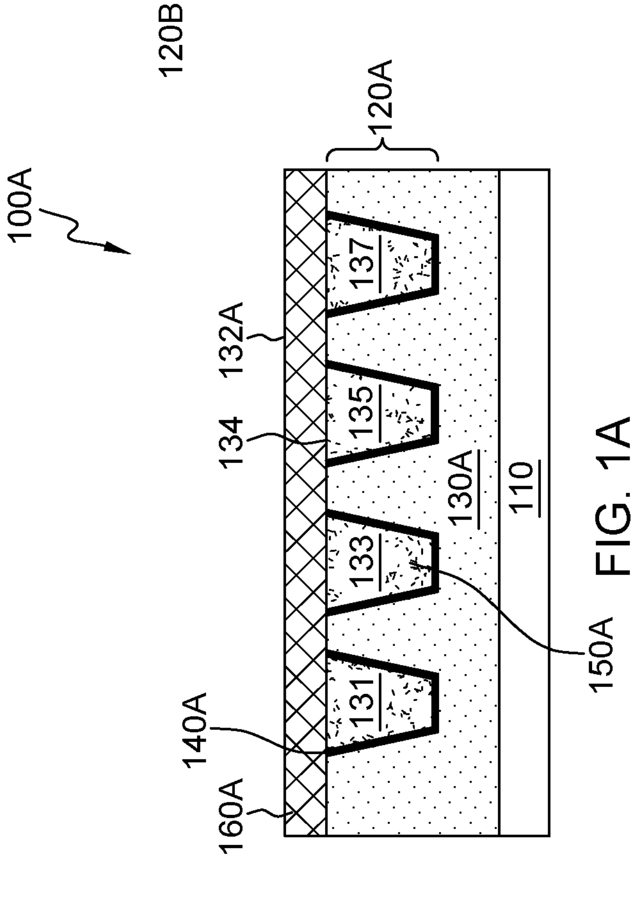
FIG. 1A illustrates a cross-sectional view of an initial semiconductor structure, generally designated 100A, in accordance with at least one embodiment of the present invention.

In some embodiments, and as depicted in FIG. 1A, substrate 110 is a bulk semiconductor wafer, such as a bulk silicon (Si), bulk germanium (Ge), bulk silicon germanium (SiGe) and/or bulk III-V semiconductor wafer. Alternatively, in other embodiments, substrate 110 is a semiconductor-on-insulator (SOI) wafer. A SOI wafer includes a SOI layer separated from a substrate by a buried insulator. When the buried insulator is an oxide, it is referred to herein as a buried oxide or BOX. The SOI layer can include any suitable semiconductor, such as Si, Ge, SiGe, and/or a III-V semiconductor.

In forming first metal layer 120A, a dielectric material is initially deposited onto substrate 110 to form dielectric layer 130A, one or more damascene processes are performed to form lines 131, 133, 135, 137 within dielectric layer 130A, followed by the deposition of a dielectric capping material to form a capping layer 160A.

Dielectric layer 130A may be composed of an inorganic dielectric material or an organic dielectric material. In some embodiments, dielectric layer 130A may be porous. In other embodiments, dielectric layer 130A may be non-porous. In some embodiments, dielectric layer 130A may have a dielectric constant (all dielectric constants mentioned herein are measured relative to a vacuum, unless otherwise stated) that is about 4.0 or less. In an embodiment, dielectric layer 130A may have a dielectric constant of 2.8 or less. These dielectrics having a dielectric constant of 2.8 or less generally have a lower parasitic cross talk as compared to dielectric materials whose dielectric constant is greater than 4.0. Examples of suitable dielectric materials that may be employed as dielectric layer 130A include, but are limited to, porous silicates, silicon dioxides, silicon oxynitrides, silicon carbides, silicon nitrides, silicon undoped or doped silicate glass, silsesquioxanes, carbon doped oxides (i.e., organosilicates) that include atoms of Si, C. O and H, and variants thereof, siloxanes, thermosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The one or more damascene processes performed to form lines 131, 133, 135, 137 within dielectric layer 130A may be performed as follows. A hard mask layer (not depicted) is formed by depositing a hard mask material (e.g., silicon nitride, titanium nitride, tantalum nitride, or any suitable metal-containing material) onto the top surface of dielectric layer 130A. The hard mask layer can be formed utilizing a deposition process including, but not limited to, CVD, PECVD, ALD, physical vapor deposition (PVD) or sputtering.

A photoresist material (not depicted) is then deposited onto the surface of the hard mask layer. The photoresist material can be applied by any suitable techniques, including, but not limited to, coating or spin-on techniques. A photomask (not depicted) patterned with shapes defining line openings (not depicted) corresponding to lines 131, 133, 135, 137 to be formed is placed over the photoresist material, and the photomask pattern is transferred to the photoresist material using a lithographic process, which creates recesses in the uncovered regions of the photoresist material. The resulting patterned photoresist material is subsequently used to create the same pattern in the hard mask layer. Dry etch techniques (for example, an anisotropic etch process, such as reactive ion etch) may be employed to selectively remove portions of the hard mask layer to form the patterned hard mask. After formation of patterned hard mask, the photoresist material may be stripped from the patterned hard mask by ashing or other suitable processes. The resulting structure may be subjected to a wet clean.

The resulting patterned hard mask, which acts as an etch mask, is formed such that the portions of the underlying dielectric layer 130A corresponding to the line openings to be formed are protected by the patterned hard mask, while the remaining portions of the underlying dielectric layer 130A are left exposed. During patterning of dielectric layer 130A using the patterned hard mask, the physically exposed portions of dielectric layer 130A are removed by an anisotropic etching process such as, for example, reactive ion etching (RIE), ion beam etching (IBE), chemical wet etching, or a combination of IBE and chemical wet etching. The etch removes the exposed portions of dielectric layer 130A that are not protected by the patterned hard mask to form the line openings corresponding to lines 131, 133, 135, 137 to be formed.

After patterning dielectric layer 130A, an optional metal liner 140A is conformally deposited onto the exposed surfaces of the patterned dielectric layer 130A, followed by the deposition of a conductive metal material to form a conductive metal layer 150A. Metal liner 140A may include one or more thin layers of material such as, for example, tantalum (Ta), tantalum nitride (TaN), titanium nitride (TiN), cobalt (Co), ruthenium (Ru), tungsten (W), tungsten nitride (WN), titanium-tungsten (TiW), tungsten nitride (WN) manganese (Mn), manganese nitride (MnN) or other liner materials (or combinations of liner materials) such as RuTaN, Ta/TaN, CoWP, NiMoP, or NiMoB which are suitable for the given application. The thin metal liner serves as a barrier diffusion layer and adhesion layer. A conformal layer of metal liner 140A may be deposited using known techniques including, but not limited to, chemical vapor deposition (CVD), plasma enhanced chemical vapor deposition (PECVD), atomic layer deposition (ALD), physical vapor deposition (PVD), sputtering, chemical solution deposition or plating. The thickness of metal liner 140A may vary depending on the deposition process used, as well as the material employed. In some embodiments, metal liner 140A may have a thickness from 2 nm to 50 nm. However, other thicknesses that are less than 2 nm, or greater than 50 nm can also be employed in embodiments of the present invention.

In some embodiments, an optional plating seed layer (not depicted) can be formed on metal liner 140A as well. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. The optional plating seed layer can be formed by a conventional deposition process including, for example, CVD, PECVD, ALD, or PVD. The thickness of the optional plating seed layer may vary depending on the material of the optional plating seed layer, as well as the technique used in forming the same. Typically, the optional plating seed layer may have a thickness from 2 nm to 80 nm. However, other thicknesses that are less than 2 nm, and greater than 80 nm can also be employed in embodiments of the present invention.

Conductive metal layer 150A is formed by depositing a conductive metal material (e.g., via atomic layer deposition (ALD), chemical vapor deposition (CVD), plasma enhanced CVD (PECVD), or any other suitable deposition techniques) within and filling the line openings of the patterned dielectric layer 130A. In an embodiment, the conductive metal material may be a metal or metal alloy including, but not limited to, copper (Cu), aluminum (Al), ruthenium (Ru), rhodium (Rh), iridium (Ir), tungsten (W), molybdenum (Mo), nickel (Ni), or an alloy thereof, such as, for example, a Cu—Al alloy.

In those embodiments in which a thin conformal copper (Cu) seed layer (not depicted) is deposited over the surface of metal liner 140A using, for example, PVD, conductive metal layer 150A may be subsequently formed by electroplating of Cu to fill the line openings. In those embodiments in which metal liner 140A is not used, conductive metal layer 150A is formed by depositing the conductive metal material directly onto the exposed surfaces of the patterned dielectric layer 130A.

A planarization process such as, for example, chemical mechanical planarization or polishing (CMP) and/or grinding, may subsequently be performed to remove portions of conductive metal layer 150A located above a top surface 132A of dielectric layer 130A. The planarization stops at top surface 132A of dielectric layer 130A, such that a top surface 134 of lines 131, 133, 135, 137 is substantially coplanar with top surface 132A of dielectric layer 130A.

An optional capping material is then deposited to form capping layer 160A. Capping layer 160A can be formed using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), spin-on coating, sputtering, and/or plating. Capping layer 160A can include, but is not limited to, silicon dioxides (SiO2), silicon nitrides (Si3N4), silicon carbides (SiC), nitrogen-hydrogen doped silicon carbides (SiC)(N,H), or any other insulators which are suitable for the given application. In those embodiments in which the optional capping layer 160A is not included, capping layer 160A may be replaced with a dielectric material, such as the same dielectric material used to form dielectric layer 130A or a different dielectric material than the dielectric material used to form dielectric layer 130A.

FIG. 1B illustrates a cross-sectional view of semiconductor structure 100A depicted in FIG. 1A after performing subsequent processing steps, generally designated 100B, in accordance with at least one embodiment of the present invention. In assembly of semiconductor structure 100B, a second metal level 120B is formed on top of first metal level 120A.

In forming second metal layer 120B, a dielectric material is initially deposited onto top surface 162A of capping layer 160A to form dielectric layer 130B, one or more damascene processes are performed to form one or more lines within dielectric layer 130B, followed by the deposition of a dielectric capping material to form a capping layer 160B.

Dielectric layer 130B may be formed from the same processes and materials as described above with reference to dielectric layer 130A of FIG. 1A. The one or more damascene processes performed to form line 161 within dielectric layer 130B may include the same processes and materials as described above with reference to lines 131, 133, 135, 137 of FIG. 1A.

For example, a patterned hard mask (not depicted) may be formed using the same processes and materials as described above with reference to FIG. 1A. The portions of dielectric layer 130B left uncovered by the patterned hard mask are removed by an anisotropic etching process such as, for example, reactive ion etching (RIE), ion beam etching (IBE), chemical wet etching, or a combination of IBE and chemical wet etching to form a patterned dielectric layer 130B, including a line opening (not depicted) corresponding to line 161 to be formed.

An optional metal liner 140B may be conformally deposited on the exposed surfaces of the patterned dielectric layer 130B, followed by an optional plating seed layer. Metal liner 140B and optional plating seed layer may be formed using the same processes and materials as described above with reference to metal liner 140A and plating seed layer of FIG. 1A.

Conductive metal layer 150B is formed within and filling the line opening (not depicted) corresponding to line 161 to be formed using the same processes and materials as described above with reference to conductive metal layer 150A of FIG. 1A. A planarization process such as, for example, chemical mechanical planarization or polishing (CMP) and/or grinding, may subsequently be performed to remove portions of conductive metal layer 150B located above a top surface 132B of dielectric layer 130B. The planarization stops at top surface 132B of dielectric layer 130B, such that a top surface 162 of line 161 is substantially coplanar with top surface 132B of dielectric layer 130B.

An optional capping material is then deposited to form a capping layer 160B. Capping layer 160B can be formed using the same processes and materials as described above with reference to capping layer 160A of FIG. 1A.

Figure 1D:
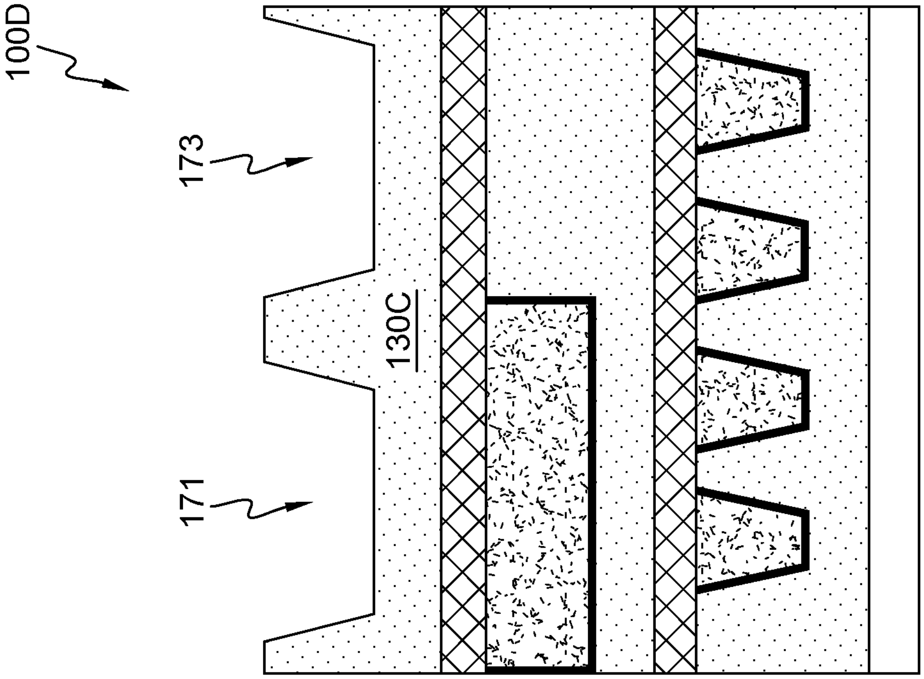
FIG. 1D illustrates a cross-sectional view of semiconductor structure 100C depicted in FIG. 1C after performing subsequent processing steps, generally designated 100D, in accordance with at least one embodiment of the present invention.
Figure 1C:
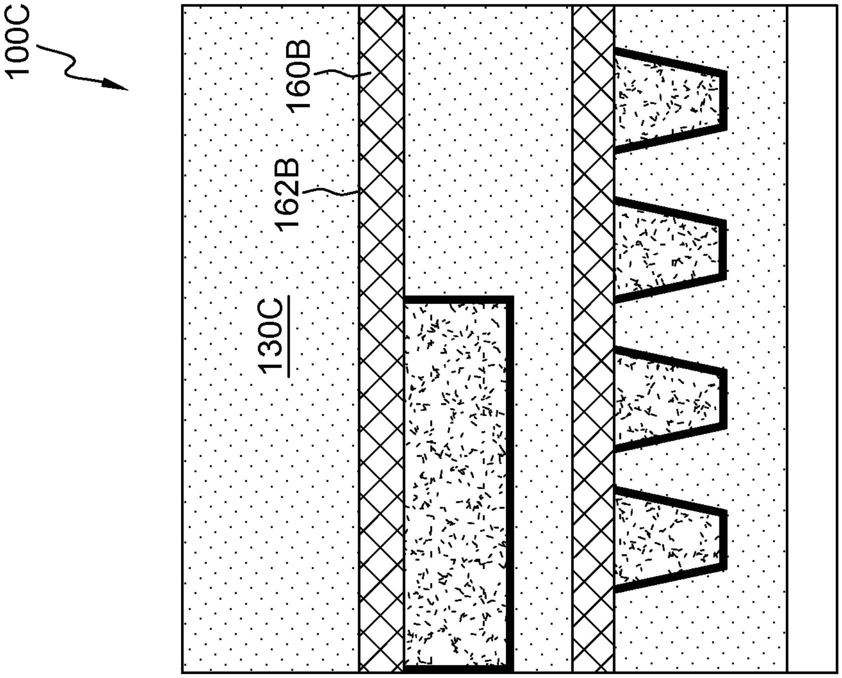
FIG. 1C illustrates a cross-sectional view of semiconductor structure 100B depicted in FIG. 1B after performing subsequent processing steps, generally designated 100C, in accordance with at least one embodiment of the present invention.

FIG. 1C illustrates a cross-sectional view of semiconductor structure 100B depicted in FIG. 1B after performing subsequent processing steps, generally designated 100C, in accordance with at least one embodiment of the present invention. In assembly of semiconductor structure 100C, a dielectric material is deposited onto top surface 162B of capping layer 160B to form dielectric layer 130C. Dielectric layer 130C can be formed using the same processes and materials as described above with reference to dielectric layer 130A of FIG. 1A.

FIG. 1D illustrates a cross-sectional view of semiconductor structure 100C depicted in FIG. 1C after performing subsequent processing steps, generally designated 100D, in accordance with at least one embodiment of the present invention. In assembly of semiconductor structure 100D, line openings 171, 173 are formed in dielectric layer 130C by patterning dielectric layer 130C using one or more damascene processes as follows.

A patterned hard mask (not depicted) may be formed using the same processes and materials as described above with reference to FIG. 1A. The portions of dielectric layer 130C left uncovered by the patterned hard mask are removed by an anisotropic etching process such as, for example, reactive ion etching (RIE), ion beam etching (IBE), chemical wet etching, or a combination of IBE and chemical wet etching to form a patterned dielectric layer 130C, including line openings 171, 173.

Figure 1F:
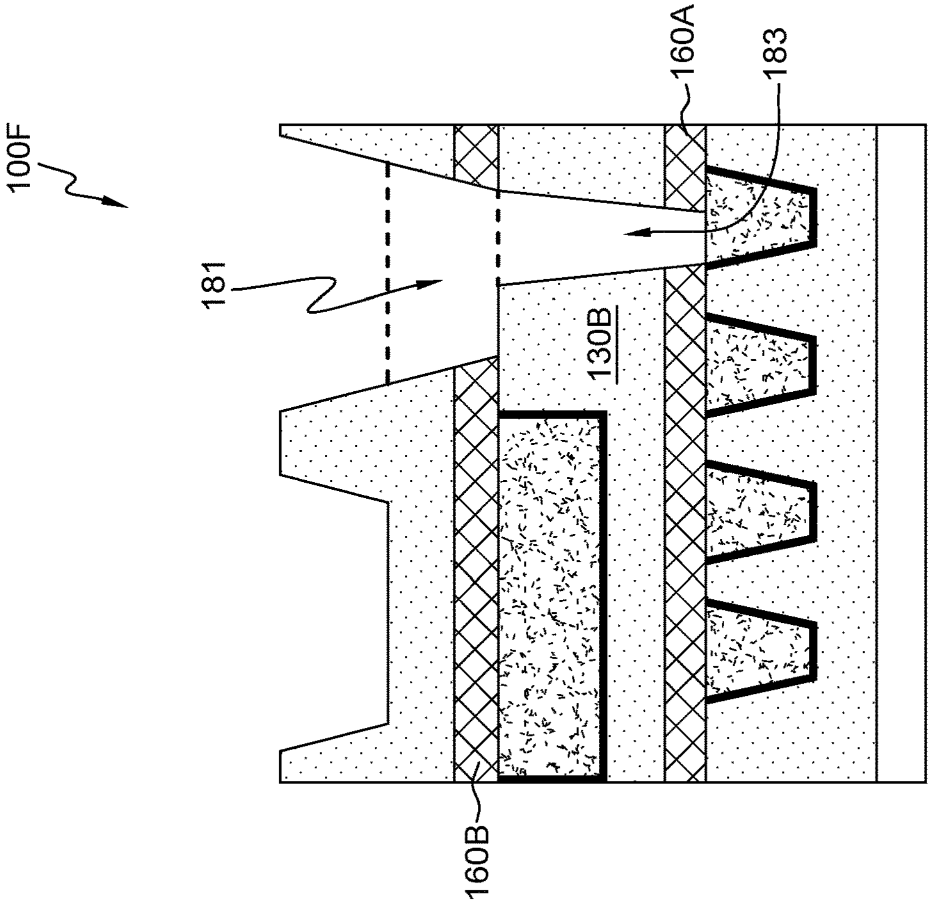
FIG. 1F illustrates a cross-sectional view of semiconductor structure 100E depicted in FIG. 1E after performing subsequent processing steps, generally designated 100F, in accordance with at least one embodiment of the present invention.
Figure 1E:
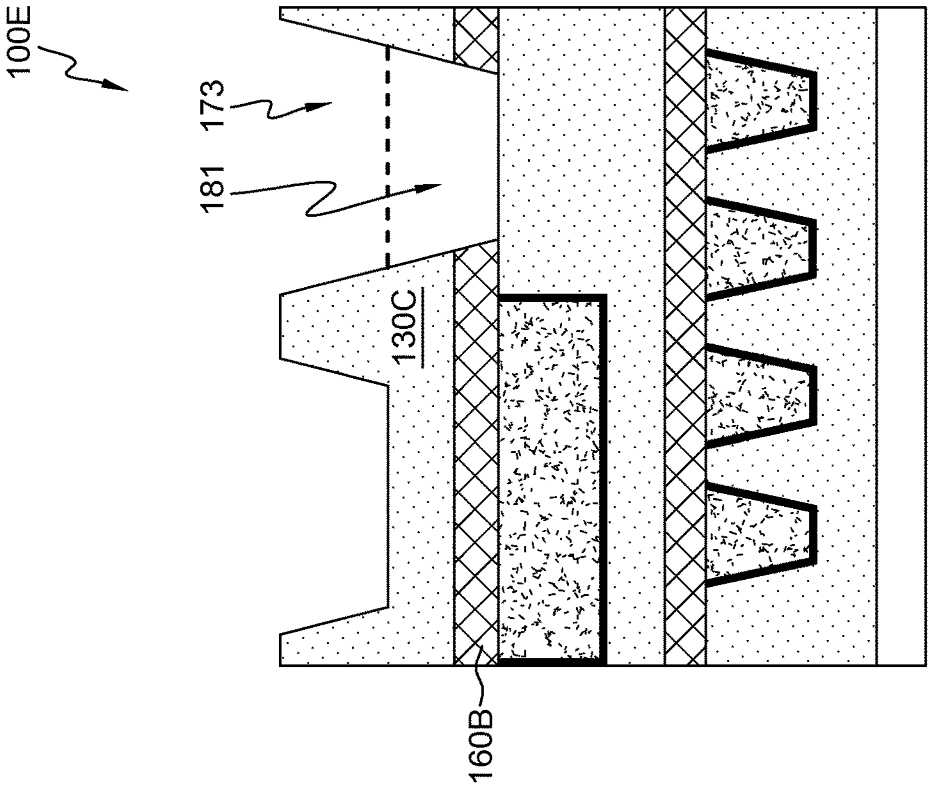
FIG. 1E illustrates a cross-sectional view of semiconductor structure 100D depicted in FIG. 1D after performing subsequent processing steps, generally designated 100E, in accordance with at least one embodiment of the present invention.

FIG. 1E illustrates a cross-sectional view of semiconductor structure 100D depicted in FIG. 1D after performing subsequent processing steps, generally designated 100E, in accordance with at least one embodiment of the present invention. In assembly of semiconductor structure 100E, a first skip via segment opening 181 is formed in a portion of dielectric layer 130C and capping layer 160B using one or more damascene processes as follows.

A patterned hard mask (not depicted) may be formed on the patterned dielectric layer 130C using the same processes and materials as described above with reference to FIG. 1A. The portions of dielectric layer 130C left uncovered by the patterned hard mask are removed by an anisotropic etching process such as, for example, reactive ion etching (RIE), ion beam etching (IBE), chemical wet etching, or a combination of IBE and chemical wet etching to form first skip via segment opening 181.

In some embodiments, and as depicted by FIG. 1E, first skip via segment opening 181 is formed below and in vertical alignment with a centerline of line opening 173. In some embodiments, and as further depicted by FIG. 1E, line opening 173 and first via segment opening 181 have a continuous taper (or continuous taper angle) of a first side and a second side, respectively. However, in other embodiments, and depending on the vertical alignment of the respective lines of metal levels 120A and 120C (depicted in FIG. 1G) to be interconnected, line opening 173 and first skip via segment opening 181 may have a continuous taper (or continuous taper angle) of a first side and a discontinuous tape (or discontinuous taper angle) of a second, side or a discontinuous taper (or discontinuous tape angle) of a first side and a second side, respectively.

FIG. 1F illustrates a cross-sectional view of semiconductor structure 100E depicted in FIG. 1E after performing subsequent processing steps, generally designated 100F, in accordance with at least one embodiment of the present invention. In assembly of semiconductor structure 100F, a second skip via segment opening 183 is formed in dielectric layer 130B and capping layer 160A using one or more damascene processes as follows.

A patterned hard mask (not depicted) may be formed on semiconductor structure 100E using the same processes and materials as described above with reference to FIG. 1A. The portions of semiconductor structure 100E left uncovered by the patterned hard mask are removed by an anisotropic etching process such as, for example, reactive ion etching (RIE), ion beam etching (IBE), chemical wet etching, or a combination of IBE and chemical wet etching to form second skip via segment opening 183.

In some embodiments, and as depicted by FIG. 1F, second skip via segment opening 183 is formed below first skip via segment opening 181 and has a narrower maximum critical dimension (CD) width and narrower minimum CD width than first skip via segment opening 181. In some embodiments, and as further depicted by FIG. 1F, first skip via segment opening 181 and second skip via segment opening

183 have a continuous taper (or continuous taper angle) of a first side and a discontinuous taper (or discontinuous taper angle) of a second side. However, in other embodiments, and depending on the vertical alignment of the respective lines of metal levels 120A and 120C (depicted in FIG. 1G) to be interconnected, first skip via segment opening 181 and second skip via segment opening 183 may have a discontinuous taper (or discontinuous tape angle) of a first side and a second side, respectively.

Figure 1G:
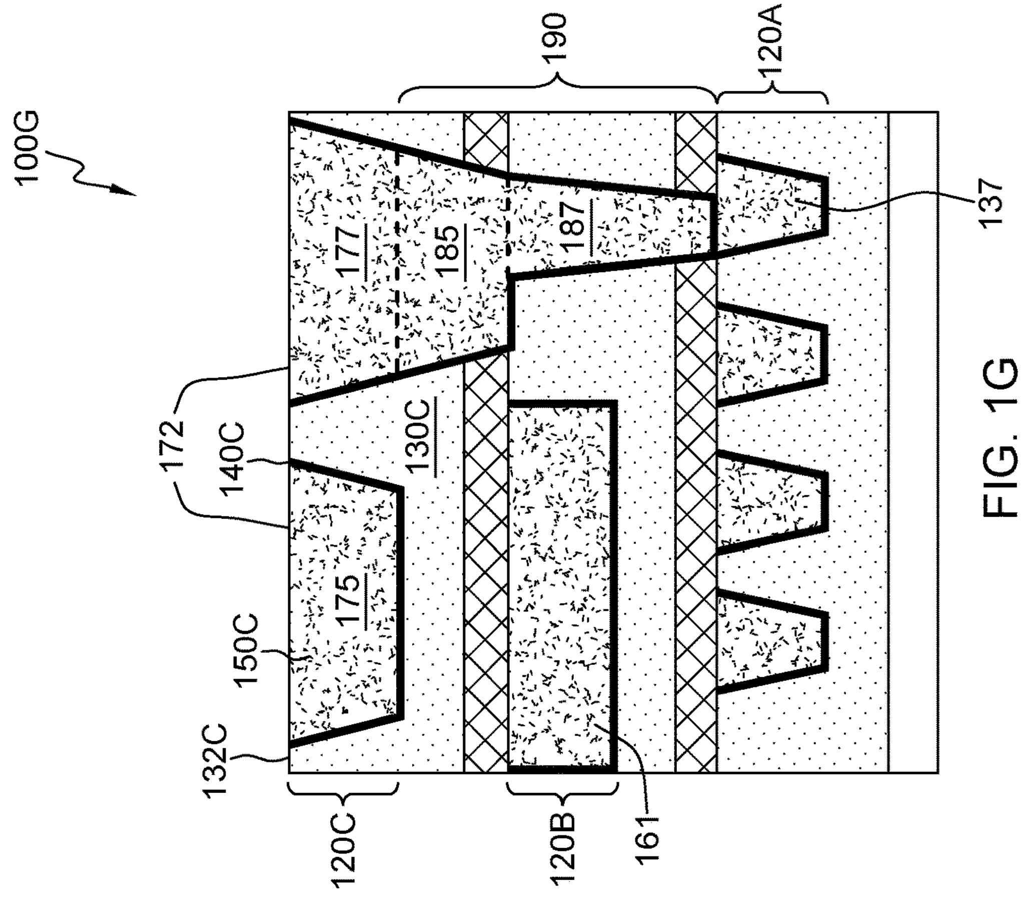
FIG. 1G illustrates a cross-sectional view of semiconductor structure 100F depicted in FIG. 1F after performing subsequent processing steps, generally designated 100G, in accordance with at least one embodiment of the present invention.

FIG. 1G illustrates a cross-sectional view of semiconductor structure 100F depicted in FIG. 1F after performing subsequent processing steps, generally designated 100G, in accordance with at least one embodiment of the present invention. In assembly of semiconductor structure 100G, lines 175, 177, and first and second skip via segments 185, 187 are formed using one or more damascene processes as follows.

An optional metal liner 140C may be conformally deposited onto the exposed surfaces of line openings 171, 173 (depicted in FIG. 1D) and first and second skip via segment openings 181, 183 (depicted in FIG. 1F), followed by an optional plating seed layer. Metal liner 140C and optional plating seed layer may be formed using the same processes and materials as described above with reference to metal liner 140A and plating seed layer of FIG. 1A.

Conductive metal layer 150C is formed within line openings 171, 173, and first and second skip via segment openings 181, 183 using the same processes and materials as described above with reference to conductive metal layer 150A of FIG. 1A. In some embodiments, and as depicted in FIG. 1G, first skip via segment 185 and second skip via segment 187 are formed from the same conductive metal material(s). In other embodiments, first skip via segment 185 and second sip via segment 187 are formed from different conductive metal materials.

A planarization process such as, for example, chemical mechanical planarization or polishing (CMP) and/or grinding, may subsequently be performed to remove portions of conductive metal layer 150C located above a top surface 132C of dielectric layer 130C. The planarization stops at top surface 132C of dielectric layer 130C, such that a top surface 172 of lines 175, 177 are substantially coplanar with top surface 132C of dielectric layer 130C.

As depicted by FIG. 1G, line 137 of metal level 120A has a centerline that is vertically offset from a centerline of line 177 of metal level 120C. In order to interconnect line 137 and line 177, first skip via segment 185 and second skip via segment 187 form a skip-level via 190 connecting line 137 of metal level 120A to line 177 of metal level 120C while bypassing line 161 of metal level 120B. In some embodiments, and as depicted by FIG. 1G, second skip via segment 187 is formed below first skip via segment 185 and has a narrower maximum critical dimension (CD) width and narrower minimum CD width than first skip via segment 185. In some embodiments, and as further depicted by FIG. 1G, first skip via segment 185 and second skip via segment 187 have a continuous taper (or continuous taper angle) of a first side and a discontinuous taper (or discontinuous taper angle) of a second side. However, in other embodiments, and depending on the vertical alignment of the respective lines of metal levels 120A and 120C to be interconnected, first skip via segment 185 and second skip via segment 187 may have a discontinuous taper (or discontinuous tape angle) of a first side and a second side, respectively.

Referring now to FIGS. 2A-2G, FIG. 2A illustrates a cross-sectional view of an initial semiconductor structure, generally designated 200A, in accordance with at least one embodiment of the present invention. In assembly of semiconductor structure 200A, a first metal level 220A is formed as follows. A dielectric layer 230A is initially formed on top of substrate 110, lines 231, 233, 235, 237 are formed within dielectric layer 230A, followed by an optional capping layer 260A. More particularly, lines 231, 233, 235, 237 include an optional metal liner 240A, an optional plating seed layer (not depicted), and a conductive metal layer 250A. As depicted, semiconductor structure 200A is the same as semiconductor structure 100A of FIG. 1A and metal level 220A may be formed using the same processes and materials used to form metal level 120A of FIG. 1A.

Figure 2A:
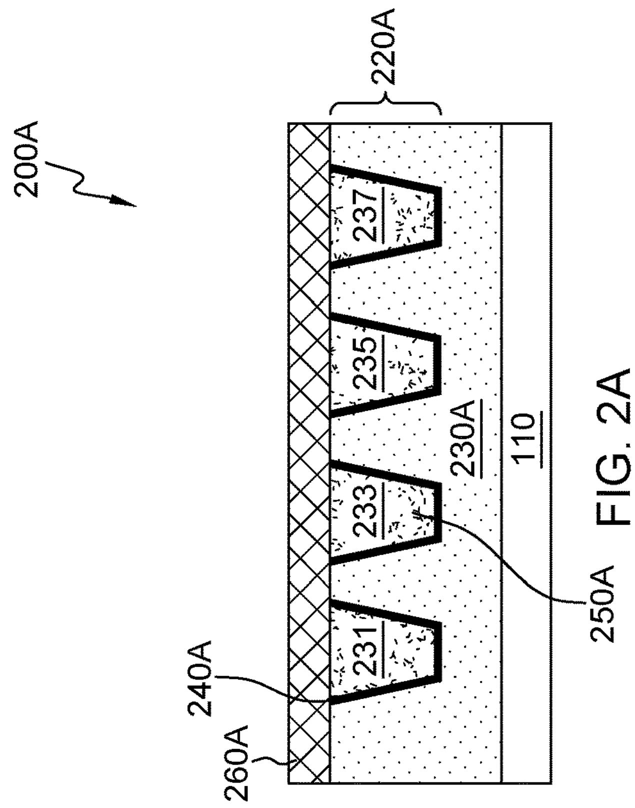
FIG. 2A illustrates a cross-sectional view of an initial semiconductor structure, generally designated 200A, in accordance with at least one embodiment of the present invention.
Figure 2B:
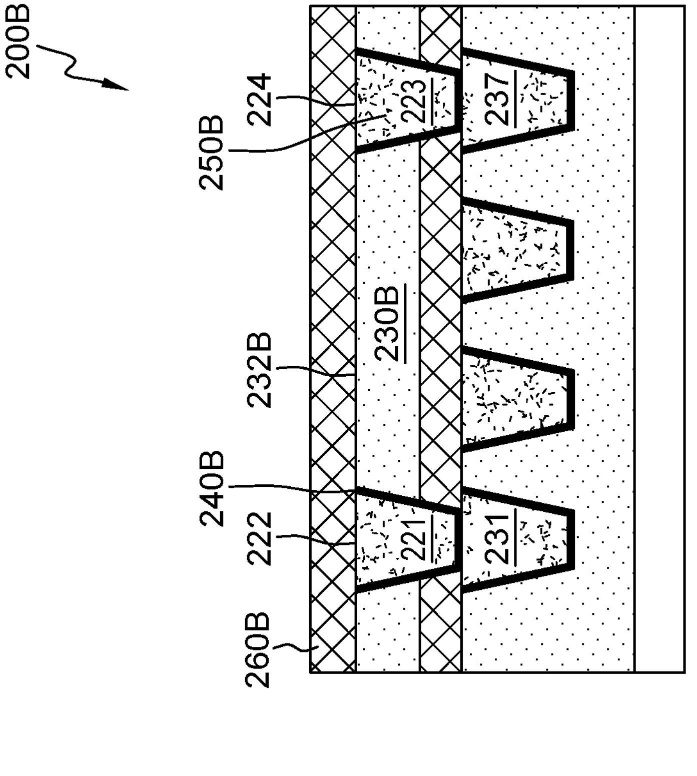
FIG. 2B illustrates a cross-sectional view of semiconductor structure 200A depicted in FIG. 2A after performing subsequent processing steps, generally designated 200B, in accordance with at least one embodiment of the present invention.

FIG. 2B illustrates a cross-sectional view of semiconductor structure 200A depicted in FIG. 2A after performing subsequent processing steps, generally designated 200B, in accordance with at least one embodiment of the present invention. In assembly of semiconductor structure 200B, an optional via 221 and a first skip via segment 223 are formed in a dielectric layer 230B as follows.

A dielectric material is initially deposited onto top surface 162A of capping layer 160A to form dielectric layer 230B. Dielectric layer 230B may be formed from the same processes and materials as described above with reference to dielectric layer 130A of FIG. 1A.

Next, one or more damascene processes are performed to form via 221 and first skip via segment 223 within dielectric layer 230B and capping layer 260A. For example, a patterned hard mask (not depicted) may be formed on dielectric layer 230B using the same processes and materials as described above with reference to FIG. 1A. The portions of dielectric layer 230B left uncovered by the patterned hard mask are removed by an anisotropic etching process such as, for example, reactive ion etching (RIE), ion beam etching (IBE), chemical wet etching, or a combination of IBE and chemical wet etching to form a patterned dielectric layer 230B, including a via opening (not depicted) corresponding to via 221 and a first skip via opening (not depicted) corresponding to first skip via segment 223 to be formed.

An optional metal liner 240B may be conformally deposited onto the exposed surfaces of the patterned dielectric layer 230B, followed by an optional plating seed layer. Metal liner 240B and optional plating seed layer may be formed using the same processes and materials as described above with reference to metal liner 140A and plating seed layer of FIG. 1A.

A conductive metal layer 250B is formed within and filling the via opening and the first skip via segment opening corresponding to via 221 and first skip via segment 223 to be formed using the same processes and materials as described above with reference to lines 131, 133, 135, 137 of FIG. 1A. As depicted by FIG. 2B, via 221 is formed above and in contact with line 231, and first skip via segment 223 is formed above and in contact with line 237.

A planarization process such as, for example, chemical mechanical planarization or polishing (CMP) and/or grinding, may subsequently be performed to remove portions of conductive metal layer 250B located above a top surface 232B of dielectric layer 230B. The planarization stops at top surface 232B of dielectric layer 230B, such that a top surface 222 of via 221 and a top surface 224 of first skip via segment 223 are substantially coplanar with top surface 232B of dielectric layer 230B.

An optional capping material is then deposited to form a capping layer 260B. Capping layer 260B can be formed using the same processes and materials as described above with reference to capping layer 160A of FIG. 1A.

Figure 2C:
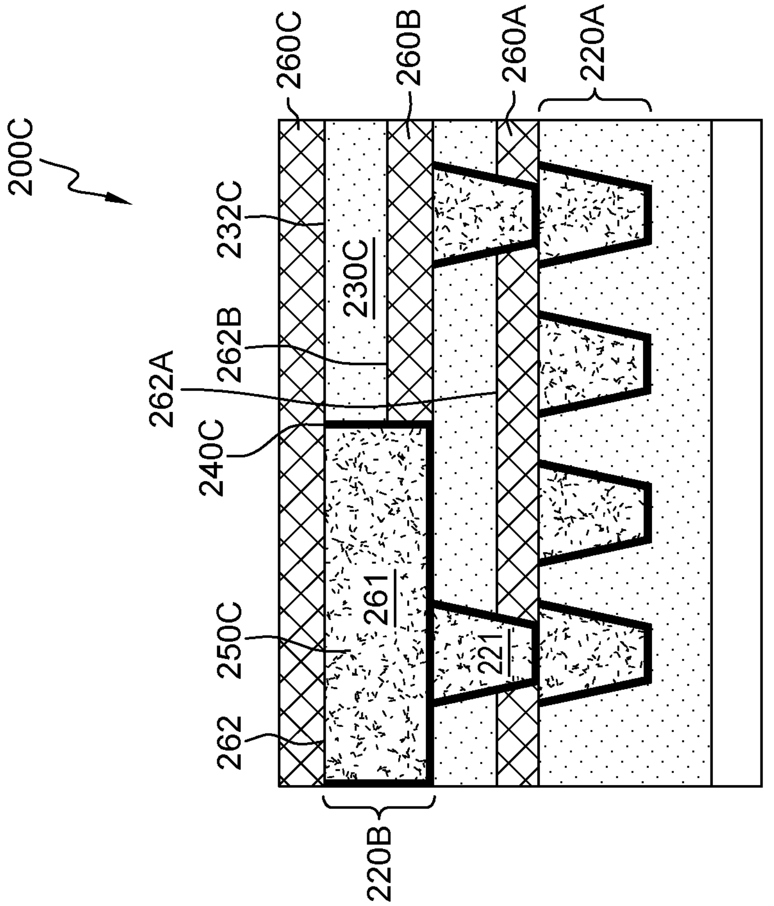
FIG. 2C illustrates a cross-sectional view of semiconductor structure 200B depicted in FIG. 2B after performing subsequent processing steps, generally designated 200C, in accordance with at least one embodiment of the present invention.

FIG. 2C illustrates a cross-sectional view of semiconductor structure 200B depicted in FIG. 2B after performing subsequent processing steps, generally designated 200C, in accordance with at least one embodiment of the present invention. In assembly of semiconductor structure 200C, a second metal level 220B is formed on top of first metal level 220A.

In forming second metal level 220B, a dielectric material is initially deposited onto top surface 262B of capping layer 260B to form a dielectric layer 230C, one or more damascene processes are performed to form one or more lines within dielectric layer 230C, followed by the deposition of a dielectric capping material to form a capping layer 260C.

Dielectric layer 230C may be formed from the same processes and materials as described above with reference to dielectric layer 130A of FIG. 1A. The one or more damascene processes performed to form line 261 within dielectric layer 230C may include the same processes and materials as described above with reference to lines 131, 133, 135, 137 of FIG. 1A.

For example, a patterned hard mask (not depicted) may be formed onto dielectric layer 230C using the same processes and materials as described above with reference to FIG. 1A. The portions of dielectric layer 230C left uncovered by the patterned hard mask are removed by an anisotropic etching process such as, for example, reactive ion etching (RIE), ion beam etching (IBE), chemical wet etching, or a combination of IBE and chemical wet etching to form a patterned dielectric layer 230C, including a line opening (not depicted) corresponding to line 261 to be formed.

An optional metal liner 240C may be conformally deposited onto the exposed surfaces of the patterned dielectric layer 230C, followed by an optional plating seed layer. Metal liner 240C and optional plating seed layer may be formed using the same processes and materials as described above with reference to metal liner 140A and plating seed layer of FIG. 1A.

Conductive metal layer 250C is formed within and filling the line opening (not depicted) corresponding to line 261 to be formed using the same processes and materials as described above with reference to conductive metal layer 150A of FIG. 1A. As depicted by FIG. 2C, line 261 is formed above and in contact with via 221.

A planarization process such as, for example, chemical mechanical planarization or polishing (CMP) and/or grinding, may subsequently be performed to remove portions of conductive metal layer 250C located above a top surface 232C of dielectric layer 230C. The planarization stops at top surface 232C of dielectric layer 230C, such that a top surface 262 of line 261 is substantially coplanar with top surface 232C of dielectric layer 230C.

An optional capping material is then deposited to form a capping layer 260C. Capping layer 260C can be formed using the same processes and materials as described above with reference to capping layer 160A of FIG. 1A.

Figure 2E:
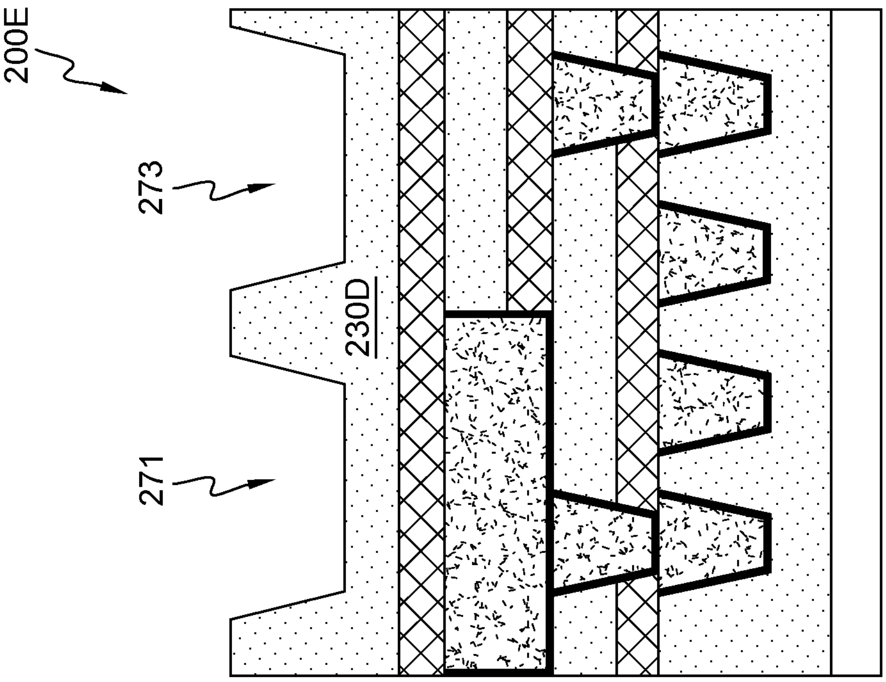
FIG. 2E illustrates a cross-sectional view of semiconductor structure 200D depicted in FIG. 2D after performing subsequent processing steps, generally designated 200E, in accordance with at least one embodiment of the present invention.
Figure 2D:
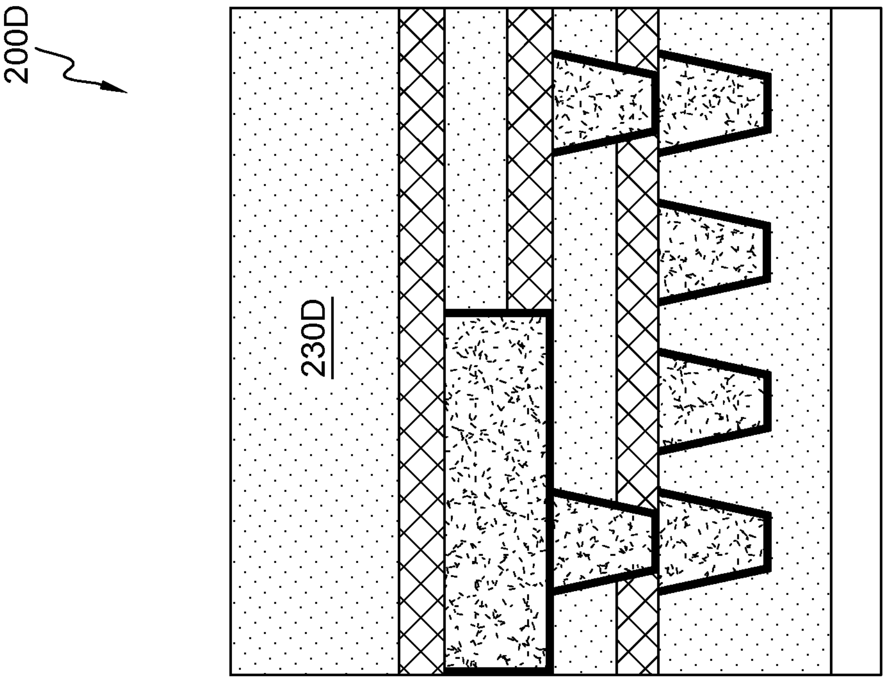
FIG. 2D illustrates a cross-sectional view of semiconductor structure 200C depicted in FIG. 2C after performing subsequent processing steps, generally designated 200D, in accordance with at least one embodiment of the present invention.

FIG. 2D illustrates a cross-sectional view of semiconductor structure 200C depicted in FIG. 2C after performing subsequent processing steps, generally designated 200D, in accordance with at least one embodiment of the present invention. In assembly of semiconductor structure 200D, a dielectric material is deposited onto the top surface of semiconductor structure 200C to form a dielectric layer 230D. Dielectric layer 230D can be formed using the same processes and materials as described above with reference to dielectric layer 130A of FIG. 1A.

FIG. 2E illustrates a cross-sectional view of semiconductor structure 200D depicted in FIG. 2D after performing subsequent processing steps, generally designated 200E, in accordance with at least one embodiment of the present invention. In assembly of semiconductor structure 200E, line openings 271, 273 are formed by patterning dielectric layer 230D using one or more damascene processes as follows.

A patterned hard mask (not depicted) may be formed using the same processes and materials as described above with reference to FIG. 1A. The portions of dielectric layer 230D left uncovered by the patterned hard mask are removed by an anisotropic etching process such as, for example, reactive ion etching (RIE), ion beam etching (IBE), chemical wet etching, or a combination of IBE and chemical wet etching to form a patterned dielectric layer 230D, including line openings 271, 273.

Figure 2G:
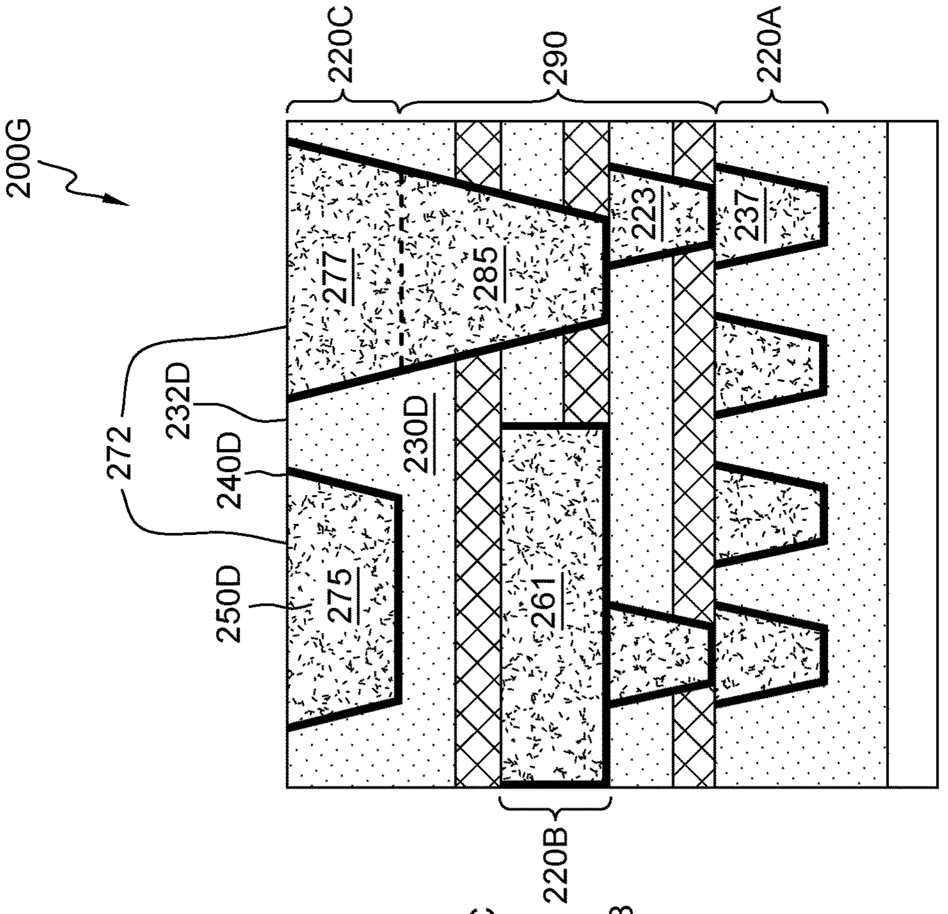
FIG. 2G illustrates a cross-sectional view of semiconductor structure 200F depicted in FIG. 2F after performing subsequent processing steps, generally designated 200G, in accordance with at least one embodiment of the present invention.
Figure 2F:
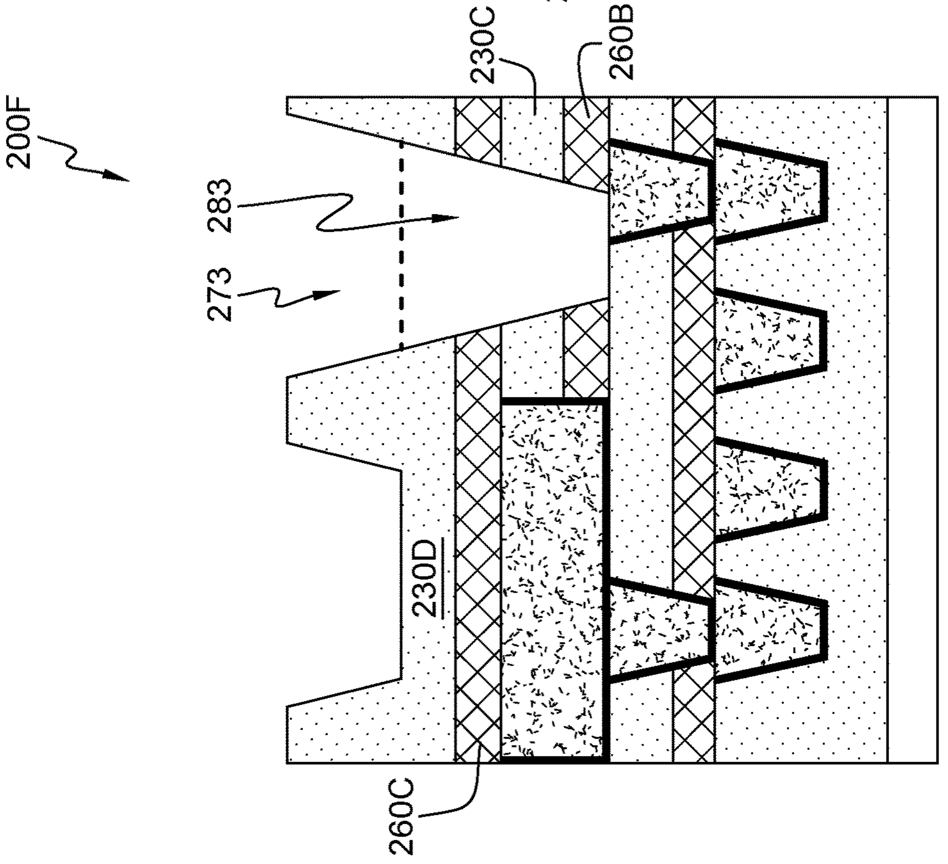
FIG. 2F illustrates a cross-sectional view of semiconductor structure 200E depicted in FIG. 2E after performing subsequent processing steps, generally designated 200F, in accordance with at least one embodiment of the present invention.

FIG. 2F illustrates a cross-sectional view of semiconductor structure 200E depicted in FIG. 2E after performing subsequent processing steps, generally designated 200F, in accordance with at least one embodiment of the present invention. In assembly of semiconductor structure 200F, a second skip via segment opening 283 is formed in a portion of dielectric layer 230D, capping layer 260C, dielectric layer 230C, and capping layer 260B using one or more damascene processes as follows.

A patterned hard mask (not depicted) may be formed on semiconductor structure 200F using the same processes and materials as described above with reference to FIG. 1A. The portions of semiconductor structure 200F left uncovered by the patterned hard mask are removed by an anisotropic etching process such as, for example, reactive ion etching (RIE), ion beam etching (IBE), chemical wet etching, or a combination of IBE and chemical wet etching to form second skip via segment opening 283.

In some embodiments, and as depicted by FIG. 2F, second skip via segment opening 283 is formed below line opening 273 and has a centerline that is in vertical alignment with a centerline of line opening 273. In some embodiments, and as further depicted by FIG. 2F, line opening 273 and second skip via segment opening 283 have a continuous taper (or continuous taper angle) of a first side and a second side, respectively. However, in other embodiments, and depending on the vertical alignment of the respective lines of metal levels 220A and 220C to be interconnected, line opening 273 and second skip via segment opening 283 may have a continuous taper (or continuous taper angle) of a first side and a discontinuous tape (or discontinuous taper angle) of a second side or a discontinuous taper (or discontinuous tape angle) of a first side and a second side, respectively.

FIG. 2G illustrates a cross-sectional view of semiconductor structure 200F depicted in FIG. 2F after performing subsequent processing steps, generally designated 200G, in accordance with at least one embodiment of the present invention. In assembly of semiconductor structure 200G, lines 275, 277, and second skip via segment 285 are formed using one or more damascene processes as follows.

An optional metal liner 240D may be conformally deposited onto the exposed surfaces of line openings 271, 273 (depicted in FIG. 2F), and second skip via segment opening 283 (depicted in FIG. 2F), followed by an optional plating seed layer. Metal liner 240D and optional plating seed layer may be formed using the same processes and materials as described above with reference to metal liner 140A and plating seed layer of FIG. 1A.

Conductive metal layer 250D is formed within and filing line openings 271, 273, and second skip via segment opening 283 using the same processes and materials as described above with reference to conductive metal layer 150A of FIG.

1A. In some embodiments, and as depicted in FIG. 1G, second skip via segment 285 and first skip via segment 223 are formed from the same conductive metal material(s). In other embodiments, second skip via segment 285 and first skip via segment 223 are formed from different conductive metal materials.

A planarization process such as, for example, chemical mechanical planarization or polishing (CMP) and/or grinding, may subsequently be performed to remove portions of conductive metal layer 250D located above a top surface 232D of dielectric layer 230D. The planarization stops at top surface 232D of dielectric layer 230D, such that a top surface 272 of lines 275, 277 are substantially coplanar with top surface 232D of dielectric layer 230D.

As depicted by FIG. 2G, line 237 of metal level 220A has a centerline that is vertically offset from a centerline of line 277 of metal level 220C. In order to interconnect line 237 and line 277, first skip via segment 223 and second skip via segment 285 form a skip-level via 290 connecting line 237 of metal level 220A to line 277 of metal level 220C while bypassing line 261 of metal level 220B. In some embodiments, and as depicted by FIG. 2G, first skip via segment 223 is formed below second skip via segment 285 and has a narrower maximum critical dimension (CD) width and narrower minimum CD width than first via segment 221. In some embodiments, and as further depicted by FIG. 2G, first skip via segment 223 and second skip via segment 285 have a continuous taper (or continuous taper angle) of a first side and a discontinuous taper (or discontinuous taper angle) of a second side. However, in other embodiments, and depending on the vertical alignment of the respective lines of metal levels 220A and 220C to be interconnected, first skip via segment 223 and second skip via segment 285 may have a discontinuous taper (or discontinuous tape angle) of a first side and a second side, respectively.

Referring now to FIGS. 3A-3G, FIG. 3A illustrates a cross-sectional view of an initial semiconductor structure, generally designated 300A, in accordance with at least one embodiment of the present invention. In assembly of semiconductor structure 300A, a first metal level 320A is formed as follows. A dielectric layer 330A is formed on top of substrate 110, lines 331, 333, 335, 337 are formed within dielectric layer 330A, followed by an optional capping layer 360A. More particularly, lines 331, 333, 335, 337 includes an optional metal liner 340A, an optional plating seed layer, and a conductive metal layer 350A. As depicted, semiconductor structure 300A is the same as semiconductor structure 100A of FIG. 1A and metal level 320A may be formed using the same processes and materials used to form metal level 120A of FIG. 1A.

Figure 3B:
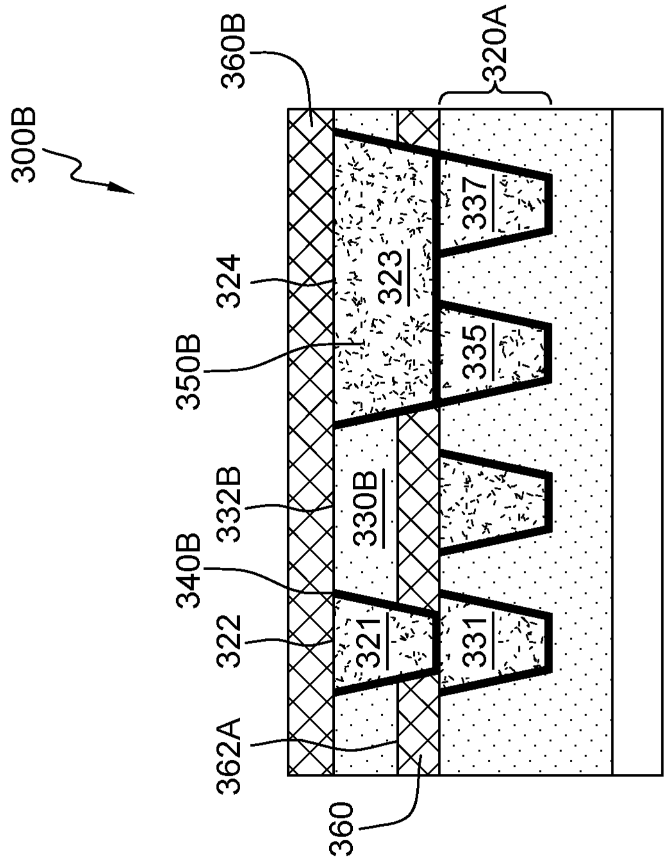
FIG. 3B illustrates a cross-sectional view of semiconductor structure 300A depicted in FIG. 3A after performing subsequent processing steps, generally designated 300B, in accordance with at least one embodiment of the present invention.
Figure 3A:
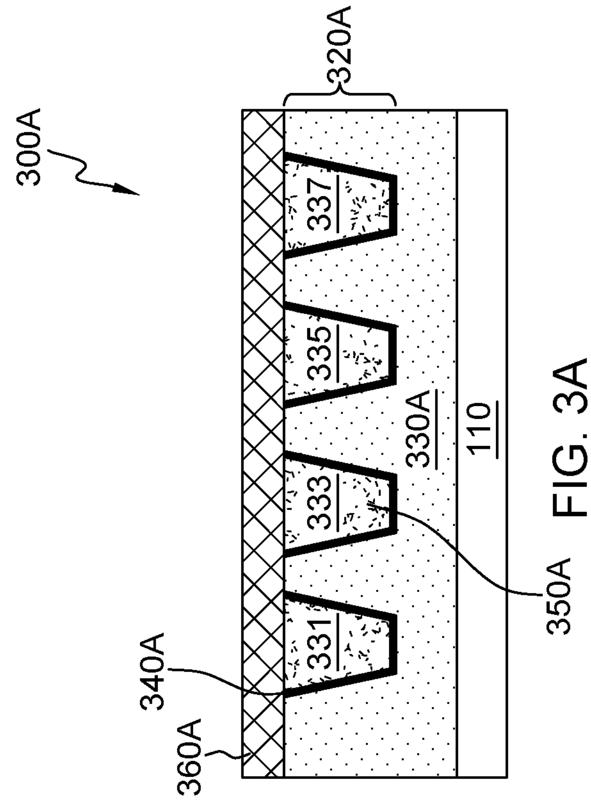
FIG. 3A illustrates a cross-sectional view of an initial semiconductor structure, generally designated 300A, in accordance with at least one embodiment of the present invention.

FIG. 3B illustrates a cross-sectional view of semiconductor structure 300A depicted in FIG. 3A after performing subsequent processing steps, generally designated 300B, in accordance with at least one embodiment of the present invention. In assembly of semiconductor structure 300B, a via 321 and a jumper 323 are formed in a dielectric layer 330B as follows.

A dielectric material is initially deposited onto top surface 362A of capping layer 360A to form dielectric layer 330B. Dielectric layer 330B may be formed from the same processes and materials as described above with reference to dielectric layer 130A of FIG. 1A.

Next, one or more damascene processes are performed to form via 321 and jumper 323 within dielectric layer 330B as follows. A patterned hard mask (not depicted) may be formed on dielectric layer 330B using the same processes and materials as described above with reference to FIG. 1A. The portions of dielectric layer 330B left uncovered by the patterned hard mask are removed by an anisotropic etching process such as, for example, reactive ion etching (RIE), ion beam etching (IBE), chemical wet etching, or a combination of IBE and chemical wet etching to form a patterned dielectric layer 330B, including a via opening (not depicted) and a jumper opening (not depicted) corresponding to via 321 and jumper 323 to be formed.

An optional metal liner 340B may be conformally deposited onto the exposed surfaces of the patterned dielectric layer 330B, followed by an optional plating seed layer. Metal liner 340B and optional plating seed layer may be formed using the same processes and materials as described above with reference to metal liner 140A and plating seed layer of FIG. 1A.

A conductive metal layer 350B is formed within and filling the via opening and jumper opening corresponding to via 321 and jumper 323 to be formed using the same processes and materials as described above with reference to lines 131, 133, 135, 137 of FIG. 1A. As depicted by FIG. 3B, via 321 is formed above and in contact with line 331 of metal layer 320A, and jumper 323 is formed above and in contact with both of lines 335, 337, thereby interconnecting lines 335, 337 with one another.

A planarization process such as, for example, chemical mechanical planarization or polishing (CMP) and/or grinding, may subsequently be performed to remove portions of conductive metal layer 350B located above a top surface 332B of dielectric layer 330B. The planarization stops at top surface 332B of dielectric layer 330B, such that a top surface 322 of via 321 and a top surface 324 of jumper 323 is substantially coplanar with top surface 332B of dielectric layer 330B.

An optional capping material is then deposited to form a capping layer 360B. Capping layer 360B can be formed using the same processes and materials as described above with reference to capping layer 160A of FIG. 1A.

Figure 3D:
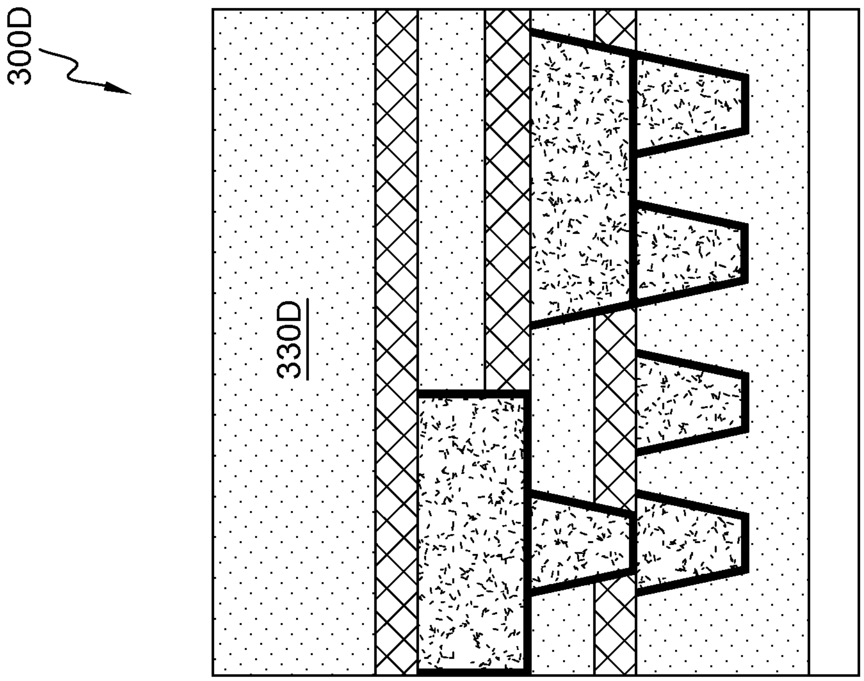
FIG. 3D illustrates a cross-sectional view of semiconductor structure 300C depicted in FIG. 3C after performing subsequent processing steps, generally designated 300D, in accordance with at least one embodiment of the present invention.
Figure 3C:
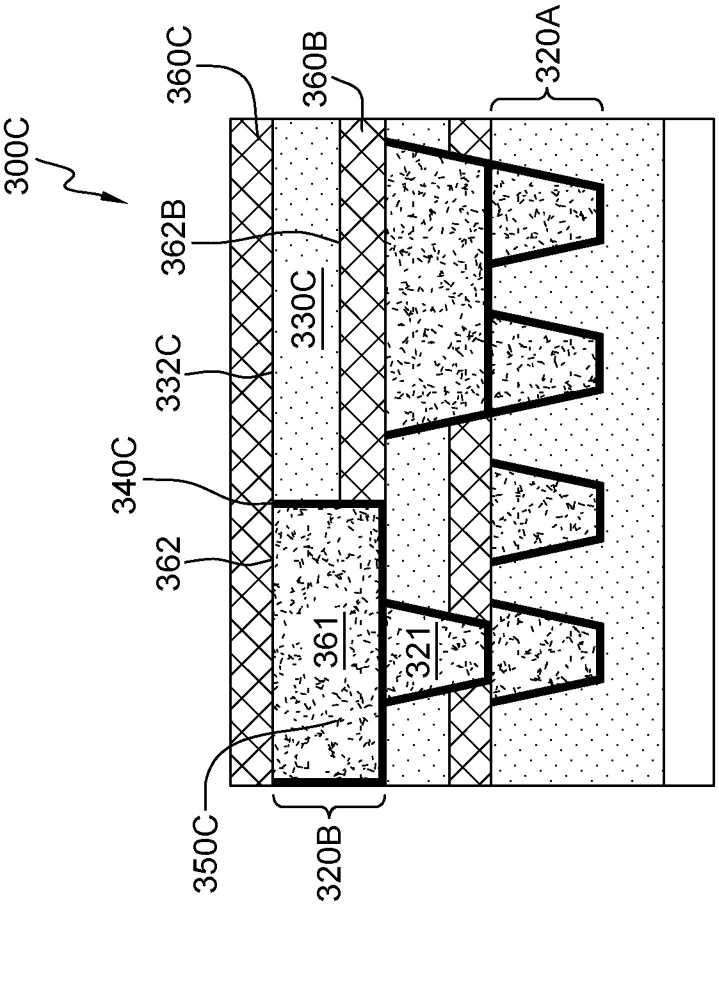
FIG. 3C illustrates a cross-sectional view of semiconductor structure 300B depicted in FIG. 3B after performing subsequent processing steps, generally designated 300C, in accordance with at least one embodiment of the present invention.

FIG. 3C illustrates a cross-sectional view of semiconductor structure 300B depicted in FIG. 3B after performing subsequent processing steps, generally designated 300C, in accordance with at least one embodiment of the present invention. In assembly of semiconductor structure 300C, a second metal level 320B is formed on top of first metal level 320A.

In forming second metal level 320B, a dielectric material is initially deposited onto top surface 362B of capping layer 360B to form dielectric layer 330C, one or more damascene processes are performed to form one or more lines within dielectric layer 330C, followed by the deposition of a dielectric capping material to form a capping layer 360C. Dielectric layer 330C may be formed from the same processes and materials as described above with reference to dielectric layer 130A of FIG. 1A. The one or more damascene processes performed to form line 361 within dielectric layer 330C may include the same processes and materials as described above with reference to lines 131, 133, 135, 137 of FIG. 1A.

For example, a patterned hard mask (not depicted) may be formed on dielectric layer 330C using the same processes and materials as described above with reference to FIG. 1A. The portions of dielectric layer 330C left uncovered by the patterned hard mask are removed by an anisotropic etching process such as, for example, reactive ion etching (RIE), ion beam etching (IBE), chemical wet etching, or a combination of IBE and chemical wet etching to form a patterned dielectric layer 330C, including a line opening (not depicted) corresponding to line 361 to be formed.

An optional metal liner 340C may be conformally deposited onto the exposed surfaces of the patterned dielectric layer 330C, followed by an optional plating seed layer. Metal liner 340C and optional plating seed layer may be formed using the same processes and materials as described above with reference to metal liner 140A and plating seed layer of FIG. 1A.

Conductive metal layer 350C is formed within and filling the line opening corresponding to line 361 to be formed using the same processes and materials as described above with reference to conductive metal layer 150A of FIG. 1A. As depicted by FIG. 3C, line 361 is formed above and in contact with via 321.

A planarization process such as, for example, chemical mechanical planarization or polishing (CMP) and/or grinding, may subsequently be performed to remove portions of conductive metal layer 350C located above a top surface 332C of dielectric layer 330C. The planarization stops at top surface 332C of dielectric layer 330C, such that a top surface 362 of line 361 is substantially coplanar with top surface 332C of dielectric layer 330C.

An optional capping material is then deposited to form a capping layer 360C. Capping layer 360C can be formed using the same processes and materials as described above with reference to capping layer 160A of FIG. 1A.

FIG. 3D illustrates a cross-sectional view of semiconductor structure 300C depicted in FIG. 3C after performing subsequent processing steps, generally designated 300D, in accordance with at least one embodiment of the present invention. In assembly of semiconductor structure 300D, a dielectric material is deposited onto the top surface of semiconductor structure 300C to form dielectric layer 330D. Dielectric layer 330D can be formed using the same processes and materials as described above with reference to dielectric layer 130A of FIG. 1A.

Figure 3E:
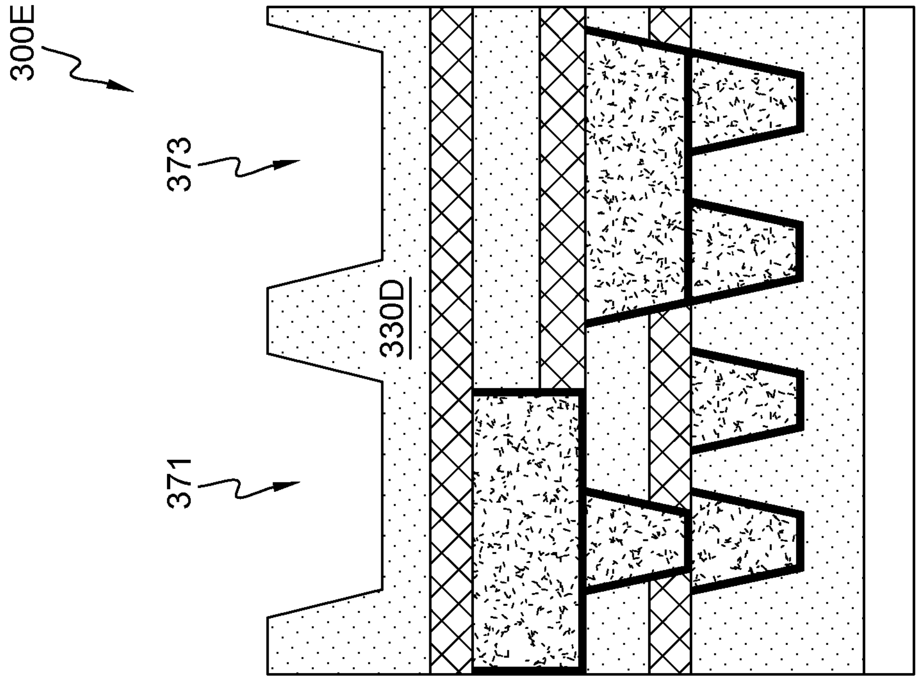
FIG. 3E illustrates a cross-sectional view of semiconductor structure 300D depicted in FIG. 3D after performing subsequent processing steps, generally designated 300E, in accordance with at least one embodiment of the present invention.

FIG. 3E illustrates a cross-sectional view of semiconductor structure 300D depicted in FIG. 3D after performing subsequent processing steps, generally designated 300E, in accordance with at least one embodiment of the present invention. In assembly of semiconductor structure 300E, line openings 371, 373 are formed by patterning dielectric layer 330D using one or more damascene processes as follows.

A patterned hard mask (not depicted) may be formed using the same processes and materials as described above with reference to FIG. 1A. The portions of dielectric layer 330D left uncovered by the patterned hard mask are removed by an anisotropic etching process such as, for example, reactive ion etching (RIE), ion beam etching (IBE), chemical wet etching, or a combination of IBE and chemical wet etching to form a patterned dielectric layer 330D, including line openings 371, 373.

Figure 3F:
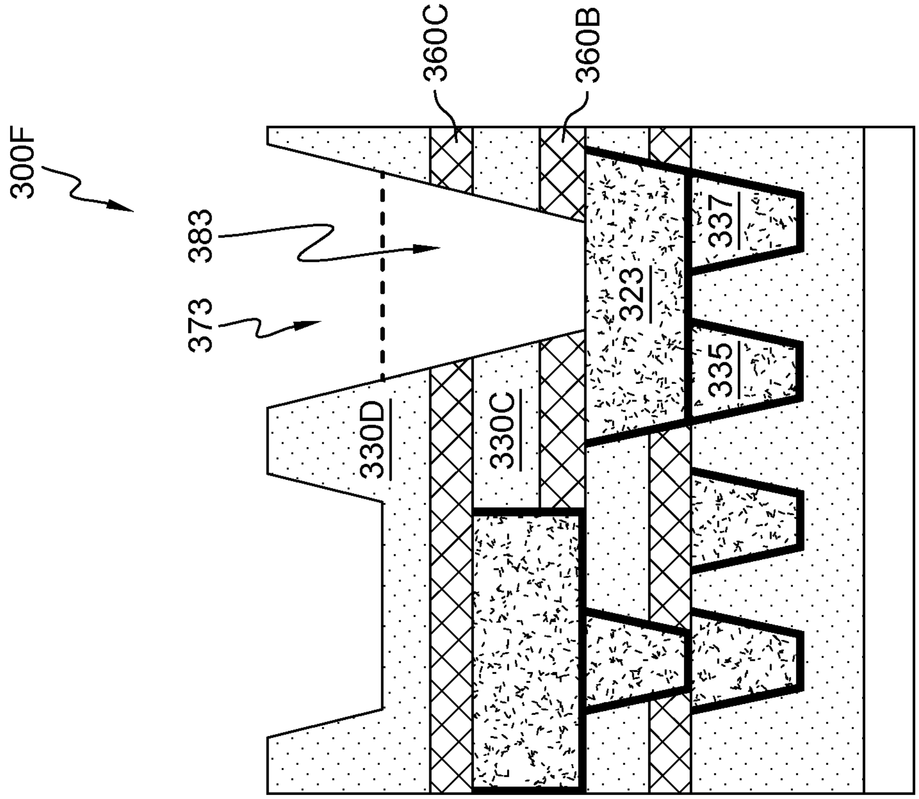
FIG. 3F illustrates a cross-sectional view of semiconductor structure 300E depicted in FIG. 3E after performing subsequent processing steps, generally designated 300F, in accordance with at least one embodiment of the present invention.

FIG. 3F illustrates a cross-sectional view of semiconductor structure 300E depicted in FIG. 3E after performing subsequent processing steps, generally designated 300F, in accordance with at least one embodiment of the present invention. In assembly of semiconductor structure 300F, a skip via opening 383 is formed in a portion of dielectric layer 330D, capping layer 360C, dielectric layer 330C, and capping layer 360B using one or more damascene processes as follows.

For example, a patterned hard mask (not depicted) may be formed on semiconductor structure 300E using the same processes and materials as described above with reference to FIG. 1A. The portions of semiconductor 300E left uncovered by the patterned hard mask are removed by an anisotropic etching process such as, for example, reactive ion etching (RIE), ion beam etching (IBE), chemical wet etching, or a combination of IBE and chemical wet etching to form skip via opening 383.

In some embodiments, and as depicted by FIG. 3F, skip via opening 383 is formed below line opening 373 and above lines 335, 337 and jumper 323. In some embodiments, and as depicted by FIG. 3F, a centerline of skip via opening 383 is vertically aligned with a centerline of line opening 373, and the centerline of skip via opening 383 is asymmetrically aligned (or offset) from a respective centerline of each of lines 335, 337 and jumper 323. In some embodiments, and as further depicted by FIG. 3F, line opening 373 and skip via opening 383 have a continuous taper (or continuous taper angle) of a first side and a second side, respectively. However, in other embodiments, and depending on the vertical alignment of the respective lines of metal levels 320A and 320C to be interconnected, line opening 373 and skip via opening 383 may have a continuous taper (or continuous taper angle) of a first side and a discontinuous tape (or discontinuous taper angle) of a second side or a discontinuous taper (or discontinuous tape angle) of a first side and a second side, respectively.

Figure 3G:
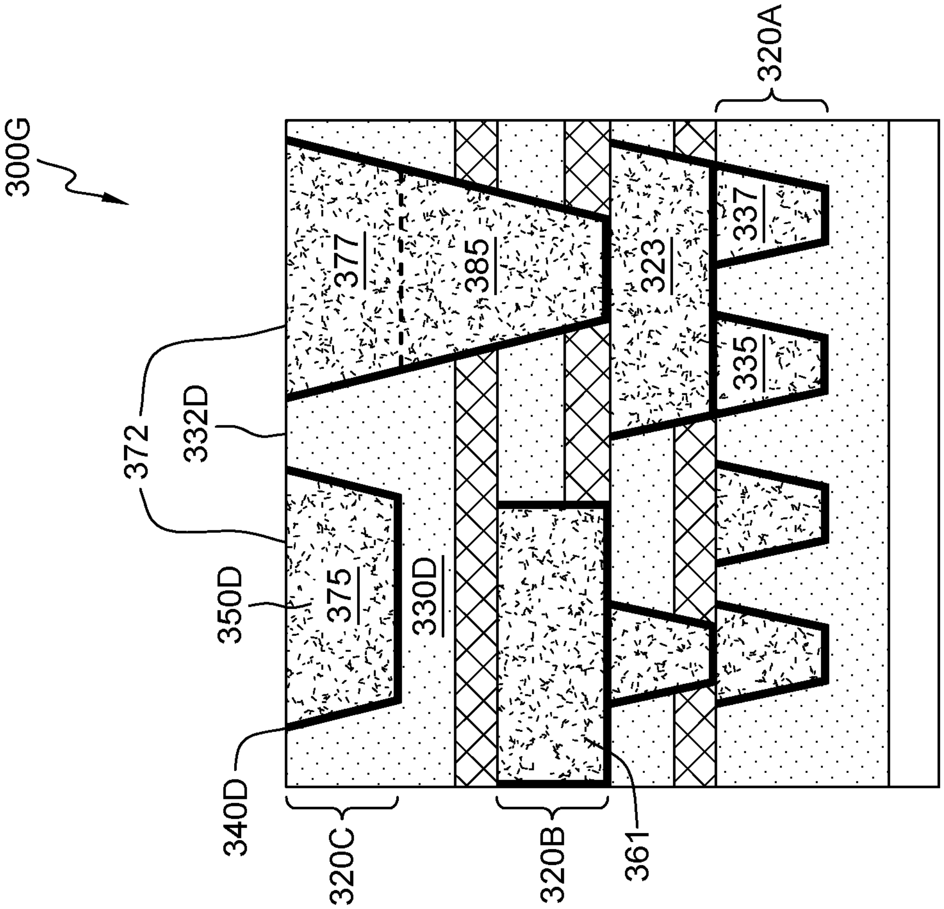
FIG. 3G illustrates a cross-sectional view of semiconductor structure 300F depicted in FIG. 3F after performing subsequent processing steps, generally designated 300G, in accordance with at least one embodiment of the present invention.

FIG. 3G illustrates a cross-sectional view of semiconductor structure 300F depicted in FIG. 3F after performing subsequent processing steps, generally designated 300G, in accordance with at least one embodiment of the present invention. In assembly of semiconductor structure 300G, lines 375, 377, and skip via 385 are formed using one or more damascene processes as follows.

An optional metal liner 340D may be conformally deposited onto the exposed surfaces of line openings 371, 373 (depicted in FIG. 3F) and skip via opening 383 (depicted in FIG. 3F), followed by an optional plating seed layer. Metal liner 340D and optional plating seed layer may be formed using the same processes and materials as described above with reference to metal liner 140A and plating seed layer of FIG. 1A.

Conductive metal layer 350D is formed within and filling line openings 371, 373, and skip via opening 383 using the same processes and materials as described above with reference to conductive metal layer 150A of FIG. 1A. In some embodiments, and as depicted in FIG. 3G, skip via 385 and jumper 323 are formed from the same conductive metal material(s). In other embodiments, skip via 385 and jumper 323 are formed from different conductive metal materials.

A planarization process such as, for example, chemical mechanical planarization or polishing (CMP) and/or grinding, may subsequently be performed to remove portions of conductive metal layer 350D located above a top surface 332D of dielectric layer 330D. The planarization stops at top surface 332D of dielectric layer 330D, such that a top surface 372 of lines 375, 377 are substantially coplanar with top surface 332D of dielectric layer 330D.

As depicted by FIG. 3G, line 377 of metal level 320C has a centerline that is vertically offset from a respective centerline of each of lines 335, 337 of metal level 320A. In order to interconnect lines 335, 337 and line 377, skip via 385 is formed on jumper 323, thereby connecting lines 335, 337 of metal level 320A to line 377 of metal level 320C while bypassing line 361 of metal level 320B. In some embodiments, and as depicted by FIG. 3G, skip via 385 is formed above jumper 323 and has a narrower maximum critical dimension (CD) width and narrower minimum CD width than jumper 323. In some embodiments, and as further depicted by FIG. 3G, skip via 385 and jumper 323 have a continuous taper (or continuous taper angle) of a first side and a discontinuous taper (or discontinuous taper angle) of a second side. However, in other embodiments, and depending on the vertical alignment of the respective lines of metal levels 320A and 320C to be interconnected, skip via 385 and jumper 323 may have a discontinuous taper (or discontinuous tape angle) of a first side and a second side, respectively.

FIGS. 4-6, generally designated 400, 500, and 600, respectfully, are methods of fabricating semiconductor interconnect structures corresponding to the semiconductor structures described with reference to FIGS. 1A-1G . . . 3A-3G, respectively. The methods of FIGS. 4-6 may be used in conjunction with, for example, any of the exemplary fabrication sequences of FIGS. 1A-1G . . . 3A-3G.

Figure 4A:
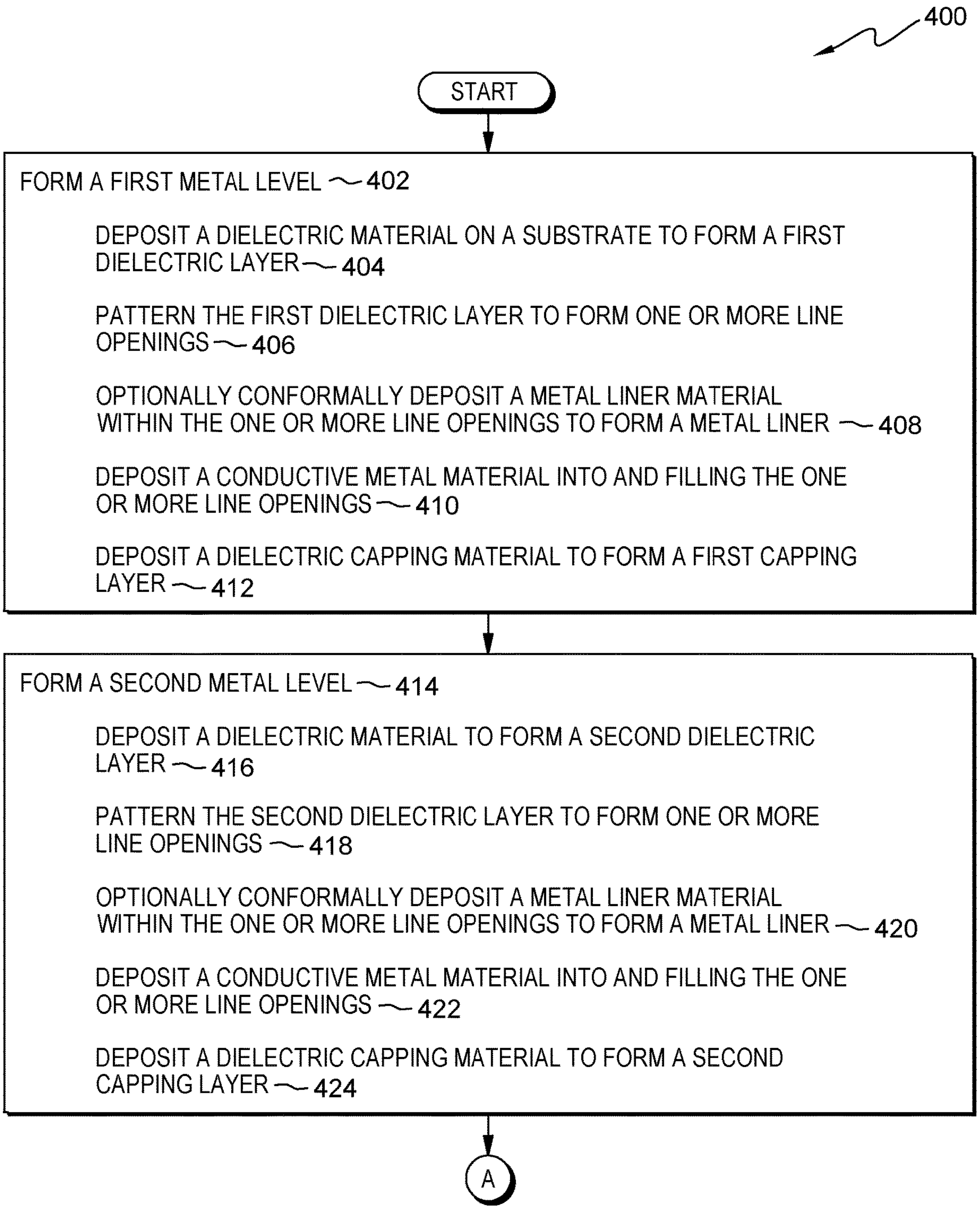
FIGS. 4A-4B, 5A-5B, and 6A-6B, generally designated 400, 500, and 600, respectfully, are methods of fabricating semiconductor interconnect structures corresponding to the semiconductor interconnect structures described with reference to FIGS. 1A-1G . . . 3A-3G. The methods 400-600 may be used in conjunction with, for example, any of the exemplary fabrication sequences of FIGS. 1A-1G . . . 3A-3G.
Figure 4B:
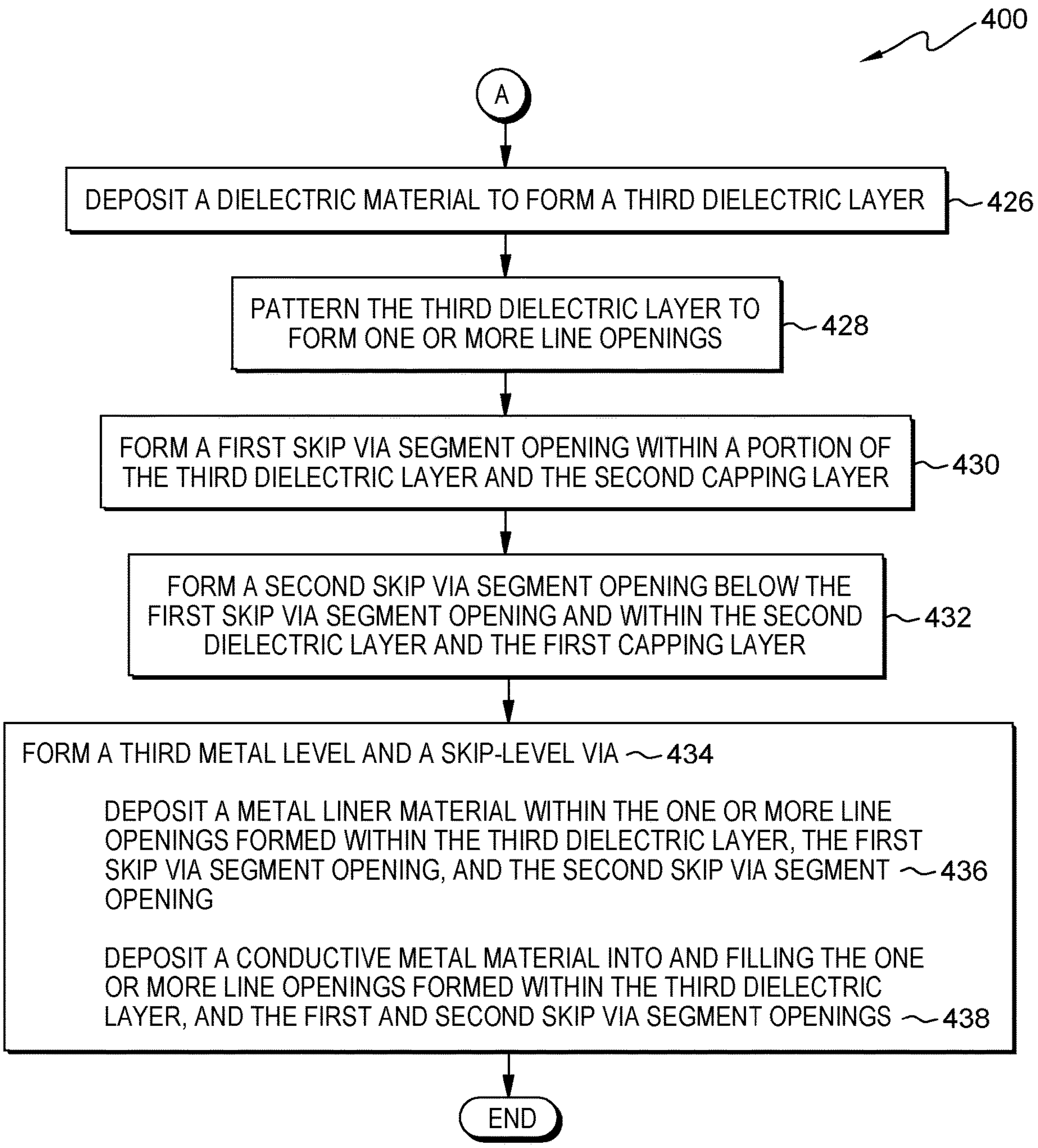

Referring now to FIGS. 4A and 4B, the method 400 optionally begins at block 402, where a first metal level is formed. Forming the first metal level comprises (at block 404), depositing a dielectric material on a substrate to form a first dielectric layer, patterning (at block 406) the first dielectric layer to form one or more line openings, optionally conformally depositing (at block 408) a metal liner material onto the surfaces of the one or more line openings to form a first metal barrier, depositing (at block 410) a conductive metal material into and filling the one or more line openings, and depositing (at block 412) a dielectric capping material to form a first capping layer.

At block 414, a second metal level is formed. Forming the second metal level comprises (at block 416), depositing a dielectric material onto the first capping layer to form a second dielectric layer, patterning (at block 418) the second dielectric layer to form one or more line openings, optionally conformally depositing (at block 420) a metal liner material onto the surfaces of the one or more line openings to form a second metal barrier, depositing (at block 422) a conductive metal material into and filling the one or more lines openings, and depositing (at block 424) a dielectric capping material to form a second capping layer.

At block 426, a dielectric material is deposited onto the second capping layer to form a third dielectric layer. At block 428, the third dielectric layer is patterned to form one or more line openings. At block 430, a first skip via segment opening is formed within a portion of the third dielectric layer and the second capping layer. At block 432, a second skip via segment opening is formed below the first skip via segment opening and within the second dielectric layer and the first capping layer.

At block 434, a third metal level and a skip-level via are formed. Forming the third metal level and the skip-level via comprises (at block 436), depositing a metal liner material onto the surfaces of the one or more line openings formed within the third dielectric layer, the first skip via segment opening formed within a portion of the third dielectric layer and the second capping layer, and the second skip via segment opening formed within the second dielectric layer and the first capping layer, and depositing (at block 438) a conductive metal material into and filling the one or more line openings formed within the third dielectric layer, and the first and second skip via segment openings.

Figure 5A:
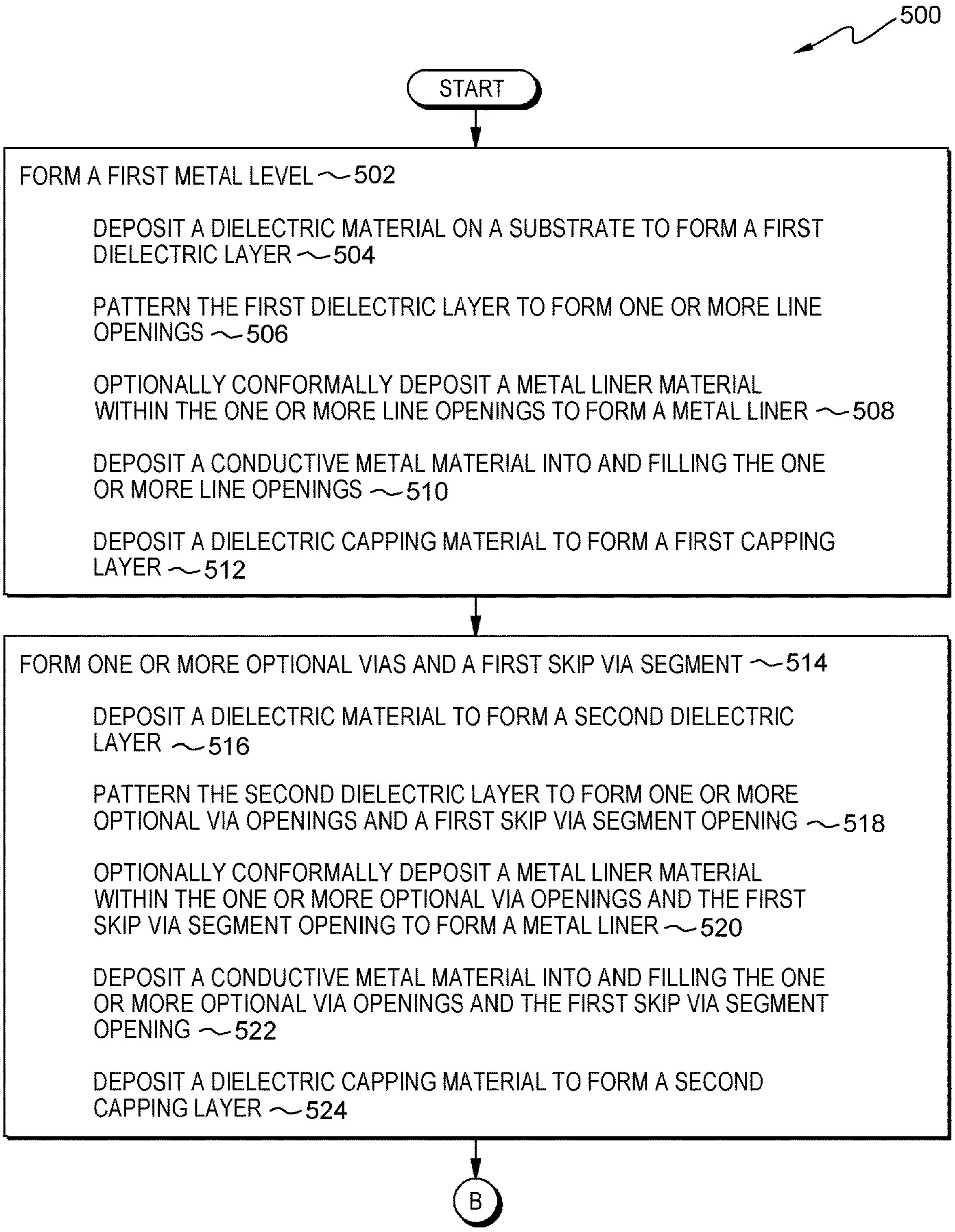
Figure 5B:
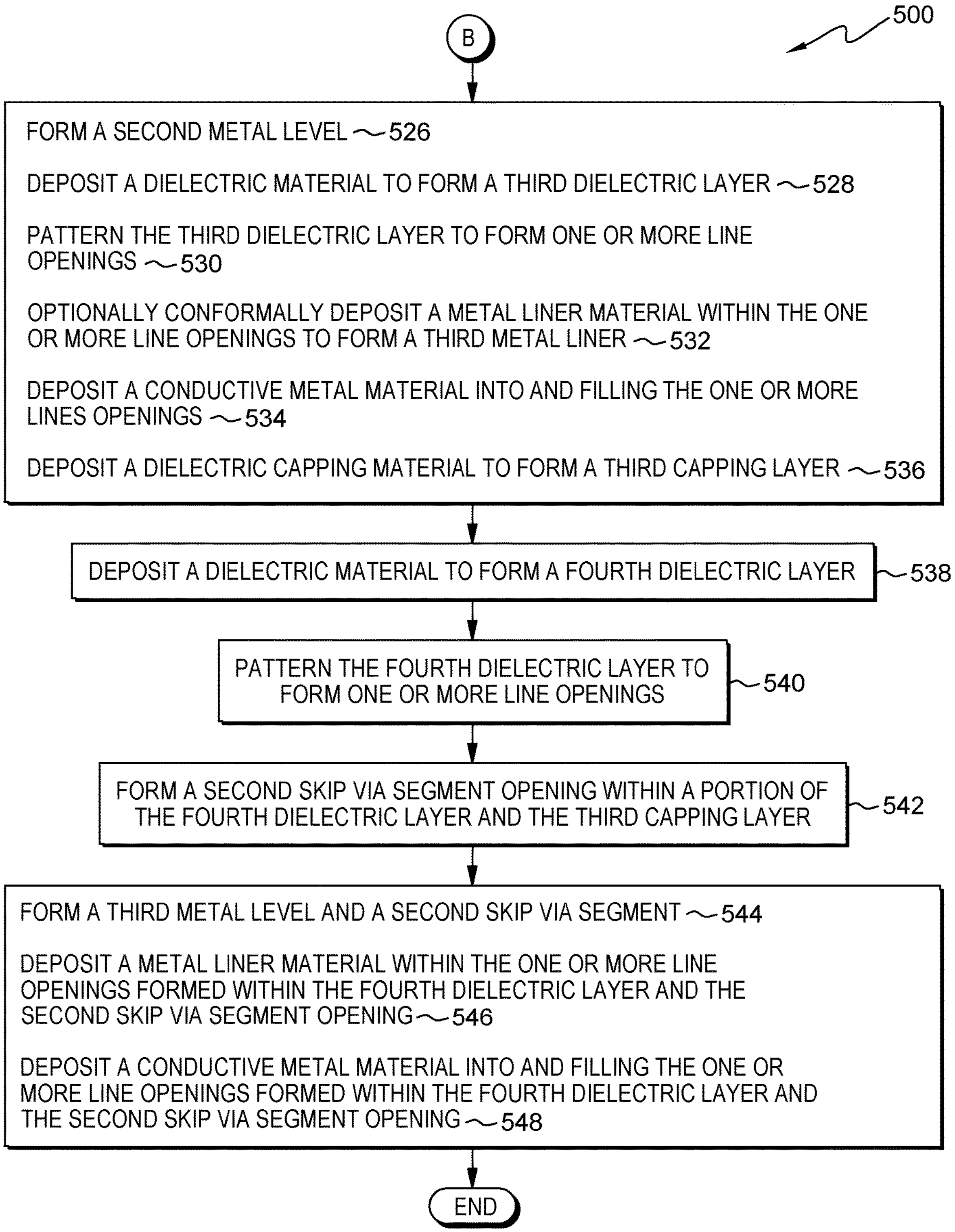

Referring now to FIGS. 5A and 5B, the method 500 optionally begins at block 502, where a first metal level is formed. Forming the first metal level comprises (at block 504), depositing a dielectric material on a substrate to form a first dielectric layer, patterning (at block 506) the first dielectric layer to form one or more line openings, optionally conformally depositing (at block 508) a metal liner material onto the surfaces of the one or more line openings to form a first metal barrier, depositing (at block 510) a conductive metal material into and filling the one or more line openings, and depositing (at block 512) a dielectric capping material to form a first capping layer.

At block 514, one or more optional vias and a first skip via segment are formed. Forming the one or more optional vias and the first skip via segment comprises (at block 516) depositing a dielectric material onto the first capping layer to form a second dielectric layer, patterning (at block 518) the second dielectric layer to form one or more optional via openings and a first skip via segment opening, optionally conformally depositing (at block 520) a metal liner material onto the surfaces of the one or more optional via openings and the first skip via segment opening to form a second metal barrier, depositing (at block 522) a conductive metal material into and filling the one or more optional via openings and the first skip via segment opening, and depositing (at block 524) a dielectric capping material to form a second capping layer. In an embodiment, the one or more optional vias are formed above and in contact with one or more metal lines of the first metal level. In an embodiment, the first skip via segment is formed above and in contact with a metal line of the first metal level.

At block 526, a second metal level is formed. Forming the second metal level comprises (at block 528), depositing a dielectric material onto the second capping layer to form a third dielectric layer, patterning (at block 530) the third dielectric layer to form one or more line openings, optionally conformally depositing (at block 532) a metal liner material onto the surfaces of the one or more line openings to form a third metal barrier, depositing (at block 534) a conductive metal material into and filling the one or more lines openings, and depositing (at block 536) a dielectric capping material to form a third capping layer.

At block 538, a dielectric material is deposited onto the third capping layer to form a fourth dielectric layer. At block 540, the fourth dielectric layer is patterned to form one or more line openings. At block 542, a second skip via segment opening is formed within a portion of the fourth dielectric layer and the third capping layer. In an embodiment, the second skip via segment opening is formed above the first skip via segment.

At block 544, a third metal level and a second skip via segment are formed. Forming the third metal level and the second skip via segment comprises (at block 546), depositing a metal liner material onto the surfaces of the one or more line openings formed within the fourth dielectric layer and the second skip via segment opening formed within the portion of the fourth dielectric layer and the third capping layer, and depositing (at block 548) a conductive metal material into and filling the one or more line openings formed within the fourth dielectric layer, and the second skip via segment opening.

Figure 6A:
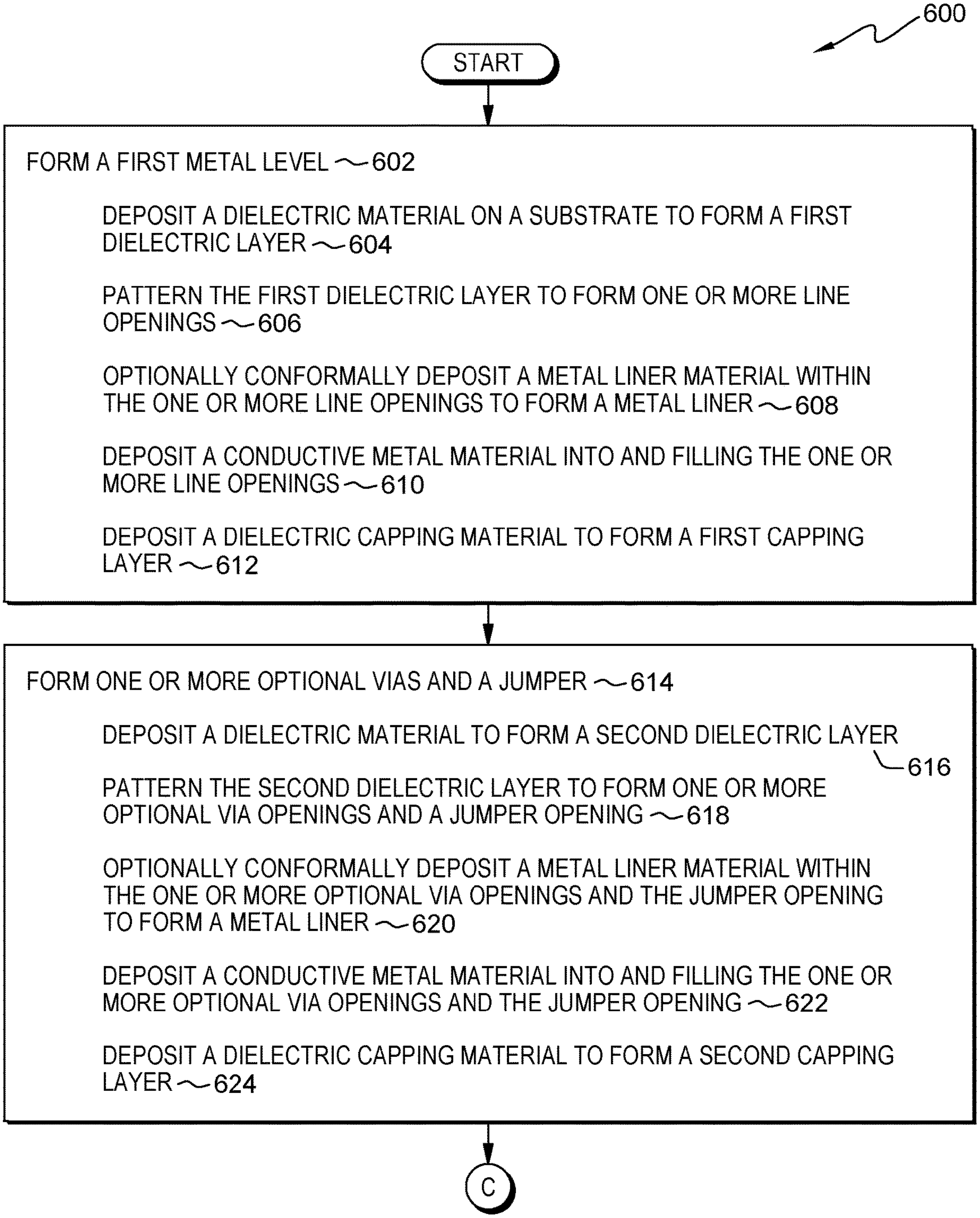
Figure 6B:
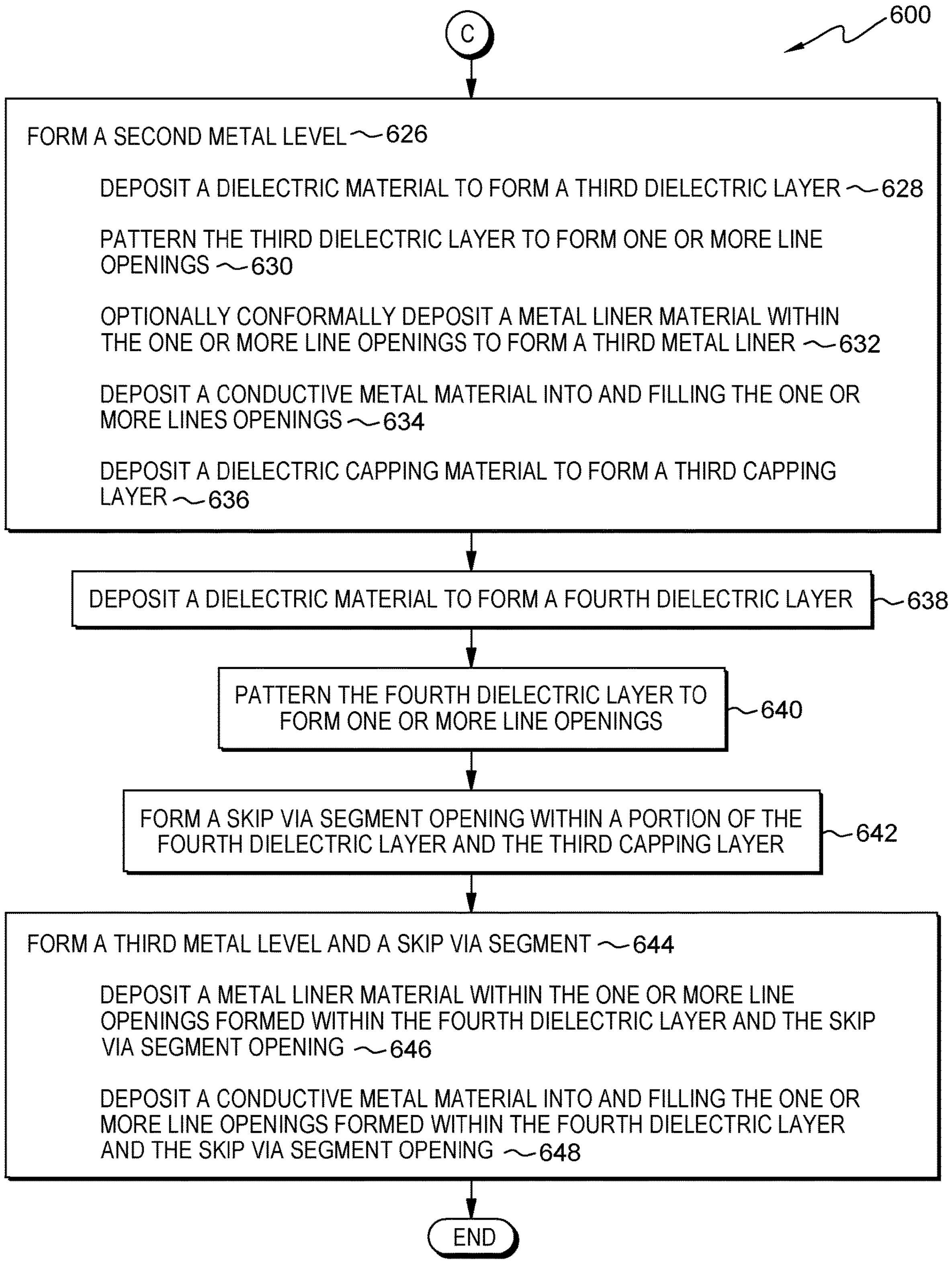

Referring now to FIGS. 6A and 6B, the method 600 optionally begins at block 602, where a first metal level is formed. Forming the first metal level comprises (at block 604), depositing a dielectric material on a substrate to form a first dielectric layer, patterning (at block 606) the first dielectric layer to form one or more line openings, optionally conformally depositing (at block 608) a metal liner material onto the surfaces of the one or more line openings to form a first metal barrier, depositing (at block 610) a conductive metal material into and filling the one or more line openings, and depositing (at block 612) a dielectric capping material to form a first capping layer.

At block 614, one or more optional vias and a first jumper are formed. Forming the one or more optional vias and the jumper comprises (at block 616) depositing a dielectric material onto the first capping layer to form a second dielectric layer, patterning (at block 618) the second dielectric layer to form one or more optional via openings and a jumper opening, optionally conformally depositing (at block 620) a metal liner material onto the surfaces of the one or more optional via openings and the jumper opening to form a second metal barrier, depositing (at block 622) a conductive metal material into and filling the one or more optional via openings and the jumper opening, and depositing (at block 624) a dielectric capping material to form a second capping layer. In an embodiment, the one or more optional vias are formed above and in contact with one or more metal lines of the first metal level. In an embodiment, the jumper is formed above and in contact with at least two adjacent metal lines of the first metal level, thereby connecting the at least two adjacent metal lines.

At block 626, a second metal level is formed. Forming the second metal level comprises (at block 628), depositing a dielectric material onto the second capping layer to form a third dielectric layer, patterning (at block 630) the third dielectric layer to form one or more line openings, optionally conformally depositing (at block 632) a metal liner material onto the surfaces of the one or more lines openings to form a third metal barrier, depositing (at block 634) a conductive metal material into and filling the one or more lines openings, and depositing (at block 636) a dielectric capping material to form a third capping layer.

At block 638, a dielectric material is deposited onto the third capping layer to form a fourth dielectric layer. At block 640, the fourth dielectric layer is patterned to form one or more line openings. At block 642, a second skip via segment opening is formed within a portion of the fourth dielectric layer and the third capping layer. In an embodiment, the second skip via segment opening is formed above the first skip via segment.

At block 644, a third metal level and a second skip via segment are formed. Forming the third metal level and the second skip via segment comprises (at block 646), depositing a metal liner material onto the surfaces of the one or more line openings formed within the fourth dielectric layer and the second skip via segment opening formed within the portion of the fourth dielectric layer and the third capping layer, and depositing (at block 648) a conductive metal material into and filling the one or more line openings formed within the third dielectric layer, and the second skip via segment opening.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A semiconductor interconnect structure, comprising:
- a first back-end-of line (BEOL) metal level including a first row of metal lines;
- a second BEOL metal level including a second row of metal lines located above the first BEOL metal level;
- a third BEOL metal level including a third row of metal lines located above the second BEOL metal level; and
- a skip via connecting a metal line of the first BEOL metal level to a metal line of the third BEOL metal level, wherein the skip via includes a first skip via segment vertically connected to a second skip via segment, the first skip via segment having a bottom surface located below a bottom surface of the second row of metal lines of the second BEOL metal level and the second skip via segment having a top surface located above a top surface of the second row of metal lines of the second BEOL metal level.

2. The semiconductor interconnect structure of claim 1, wherein a centerline along a y-axis of the metal line of the first BEOL metal level is offset from a centerline along the y-axis of the metal line of the third BEOL metal level.

3. The semiconductor interconnect structure of claim 1, wherein the first skip via segment and the second skip via segment are composed of similar conductive metal materials.

4. The semiconductor interconnect structure of claim 1, wherein the first skip via segment and the second skip via segment are composed of different conductive metal materials.

5. The semiconductor interconnect structure of claim 1, wherein the first skip via segment and the second skip via segment have a continuous taper angle of a first side and a discontinuous taper angle of a second side.

6. The semiconductor interconnect structure of claim 1, wherein the first skip via segment and the second skip via segment have a first discontinuous taper angle of a first side and a second discontinuous taper angle of a second side.

7. A semiconductor interconnect structure, comprising:
- a first back-end-of line (BEOL) metal level including a first row of metal lines;
- a second BEOL metal level including a second row of metal lines located above the first BEOL metal level;
- a third BEOL metal level including a third row of metal lines located above the second BEOL metal level;

a jumper connecting a first metal line to a second metal line located adjacent to the first metal line of the first BEOL metal level; and a skip via connecting the jumper to a metal line of the third BEOL metal level.

8. The semiconductor interconnect structure of claim 7, wherein a centerline along a y-axis of at least one of the first metal line or the second metal line of the first BEOL metal level is offset from a centerline along the y-axis of the metal line of the third BEOL metal level.

9. The semiconductor interconnect structure of claim 7, wherein a centerline along a y-axis of the jumper is offset from a centerline along the y-axis of the metal line of the third BEOL metal level.

10. The semiconductor interconnect structure of claim 7, wherein the skip via and the jumper are composed of similar conductive metal materials.

11. The semiconductor interconnect structure of claim 7, wherein the skip via and the jumper are composed of different conductive metal materials.

12. The semiconductor interconnect structure of claim 7, wherein the skip via and the jumper have a continuous taper angle of a first side and a discontinuous taper angle of a second side.

13. The semiconductor interconnect structure of claim 7, wherein the skip via and the jumper have a first discontinuous taper angle of a first side and a second discontinuous taper angle of a second side.

14. A method of forming a semiconductor interconnect structure, comprising:

forming a first BEOL metal level, wherein the first BEOL metal level includes a first row of metal lines;

forming a second BEOL metal level above the first BEOL metal level, wherein the second BEOL metal level includes a second row of metal lines;

forming a third BEOL metal level above the second BEOL metal level, wherein the third BEOL metal level includes a third row of metal lines; and forming a skip via that connects a metal line of the first BEOL metal level to a metal line of the third BEOL metal level, wherein the skip via includes a first skip via segment vertically connected to a second skip via segment, the first skip via segment having a bottom surface located below a bottom surface of the second row of metal lines of the second BEOL metal level and the second skip via segment having a top surface located above a top surface of the second row of metal lines of the second BEOL metal level.

15. The method of claim 14, wherein forming the skip via includes:

forming a first line opening in a third dielectric layer of the third BEOL metal level;

forming a first skip via segment opening in a portion of the third dielectric layer below the first line opening;

forming a second skip via segment opening in a second dielectric layer of the second BEOL metal level below the first skip via segment opening; and depositing at least one conductive metal material into and filling the first line opening, the first skip via segment opening, and the second skip via segment opening to form the metal line of the third BEOL metal level, the first skip via segment, and the second skip via segment.

16. The method of claim 15, wherein depositing the at least one conductive metal material into and filling the first line opening, the first skip via segment opening, and the second skip via segment opening includes:

depositing a first conductive metal material into and filling the second skip via segment; and depositing a second conductive metal material into and filling the second skip via segment located above the first skip via segment, wherein the second conductive metal material is different than the first conductive metal material.

17. The method of claim 15, wherein forming the second skip via segment opening in the second dielectric layer of the second BEOL metal level below the first skip via segment opening includes:

etching the second dielectric layer of the second BEOL metal level such that the first skip via segment opening and the second skip via segment opening have a continuous taper angle of a first side and a discontinuous taper angle of a second side.

18. The method of claim 15, wherein forming the second skip via segment opening in the second dielectric layer of the second BEOL metal level below the first skip via segment opening includes:

etching the second dielectric layer of the second BEOL metal level such that first the first skip via segment opening and the second skip via segment opening have a first discontinuous continuous taper angle of a first side and a second discontinuous taper angle of a second side.

* * * * *